United States Patent
Brodsky et al.

(10) Patent No.: US 9,029,959 B2
(45) Date of Patent: May 12, 2015

(54) COMPOSITE HIGH-K GATE DIELECTRIC STACK FOR REDUCING GATE LEAKAGE

(75) Inventors: MaryJane Brodsky, Salt Point, NY (US); Michael P. Chudzik, Danbury, CT (US); Min Dai, Mahwah, NJ (US); Joseph F. Shepard, Jr., Poughkeepsie, NY (US); Shahab Siddiqui, White Plains, NY (US); Yanfeng Wang, Fishkill, NY (US); Jinping Liu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 13/537,101

(22) Filed: Jun. 29, 2012

(65) Prior Publication Data

US 2014/0001570 A1    Jan. 2, 2014

(51) Int. Cl.
| | |
|---|---|
| *H01L 29/49* | (2006.01) |
| *H01L 21/02* | (2006.01) |
| *H01L 21/28* | (2006.01) |
| *H01L 21/3115* | (2006.01) |
| *H01L 21/8234* | (2006.01) |
| *H01L 29/51* | (2006.01) |

(52) U.S. Cl.
CPC .... *H01L 21/02321* (2013.01); *H01L 21/28194* (2013.01); *H01L 21/3115* (2013.01); *H01L 21/823462* (2013.01); *H01L 29/513* (2013.01); *H01L 29/517* (2013.01)

(58) Field of Classification Search
USPC ............ 257/79, 213, 270, 288, 368, 411, 410
See application file for complete search history.

(56) References Cited

U.S. PATENT DOCUMENTS

| | | | |
|---|---|---|---|
| 6,585,823 B1 | 7/2003 | Van Wijck | |
| 8,017,469 B2 | 9/2011 | Luo et al. | |
| 8,034,678 B2 | 10/2011 | Kobayashi | |
| 8,252,649 B2 * | 8/2012 | Stahrenberg et al. | 438/275 |
| 2005/0136584 A1 | 6/2005 | Boyanov et al. | |
| 2009/0039436 A1 | 2/2009 | Doris et al. | |
| 2010/0173457 A1 | 7/2010 | Herner et al. | |
| 2010/0197128 A1 | 8/2010 | Schaeffer et al. | |

FOREIGN PATENT DOCUMENTS

KR    20110031103 A    3/2011

OTHER PUBLICATIONS

Application No. PCT/US2013/042401 Filed: May 23, 2013 PCT International Search Report and Written Opinion.

* cited by examiner

*Primary Examiner* — Michael Shingleton
(74) *Attorney, Agent, or Firm* — Scully, Scott, Murphy & Presser, P.C.; Yuanmin Cai

(57) ABSTRACT

A composite high dielectric constant (high-k) gate dielectric includes a stack of a doped high-k gate dielectric and an undoped high-k gate dielectric. The doped high-k gate dielectric can be formed by providing a stack of a first high-k dielectric material layer and a dopant metal layer and annealing the stack to induce the diffusion of the dopant metal into the first high-k dielectric material layer. The undoped high-k gate dielectric is formed by subsequently depositing a second high-k dielectric material layer. The composite high-k gate dielectric can provide an increased gate-leakage oxide thickness without increasing inversion oxide thickness.

12 Claims, 24 Drawing Sheets

COMPOSITE HIGH-K GATE DIELECTRIC STACK FOR REDUCING GATE LEAKAGE

BACKGROUND

The present disclosure generally relates to semiconductor devices, and particularly to semiconductor structures including a field effect transistor with a composite high-k gate dielectric stack, and methods of manufacturing the same.

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 2 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

The EOT of a high-k gate dielectric as measured by the inversion thickness needs to be reduced to enhance the performance of a field effect transistor. However, reduction of the EOT as measured by the inversion thickness is limited by the EOT as measured by the gate leakage current. Thus, while reduction of the EOT as measured by the inversion thickness is desirable, reduction of the EOT as measured by the gate leakage current (which means an increase in the gate leakage current) is not desirable.

SUMMARY

A composite high dielectric constant (high-k) gate dielectric includes a stack of a doped high-k gate dielectric and an undoped high-k gate dielectric. The doped high-k gate dielectric can be formed by providing a stack of a first high-k dielectric material layer and a dopant metal layer and annealing the stack to induce the diffusion of the dopant metal into the first high-k dielectric material layer. The undoped high-k gate dielectric can be formed by subsequently depositing a second high-k dielectric material layer. The composite high-k gate dielectric can provide an increased gate-leakage oxide thickness without increasing inversion oxide thickness.

According to an aspect of the present disclosure, a semiconductor structure is provided, which includes a first field effect transistor having a first gate dielectric and a second field effect transistor having a second gate dielectric. The first gate dielectric includes a first doped high dielectric constant (high-k) gate dielectric and a first undoped high-k gate dielectric. The first doped high-k gate dielectric includes a first high-k dielectric material having a dielectric constant greater than 3.9 and is doped with a first dopant metal. The first undoped high-k gate dielectric includes a second high-k gate dielectric material. The second gate dielectric includes a second doped high-k gate dielectric and a second undoped high-k gate dielectric. The second doped high-k gate dielectric includes the first high-k dielectric material, and is doped with a second dopant metal that is different from the first dopant metal. The second undoped high-k gate dielectric includes the second high-k gate dielectric material.

According to another aspect of the present disclosure, a method of forming a semiconductor structure is provided. A first high dielectric constant (high-k) dielectric material layer is formed over a semiconductor substrate. A first dopant metal layer is formed directly on at least a first portion of first high-k dielectric material layer. A second dopant metal layer is formed directly on a second portion of the first high-k dielectric material layer. The first high-k dielectric material layer, the first dopant metal layer, and the second dopant metal layer are annealed. A first doped high-k gate dielectric layer including materials of the first portion of first high-k dielectric material layer and the first dopant metal layer is formed by the anneal. Further, a second doped high-k gate dielectric layer including materials of the second portion of first high-k dielectric material layer and the second dopant metal layer is formed by the anneal. A second high-k dielectric material layer is formed over the first doped high-k gate dielectric layer and the second doped high-k gate dielectric layer. The second high-k dielectric material layer includes an undoped high-k dielectric material.

DETAILED DESCRIPTION

Figure 1:
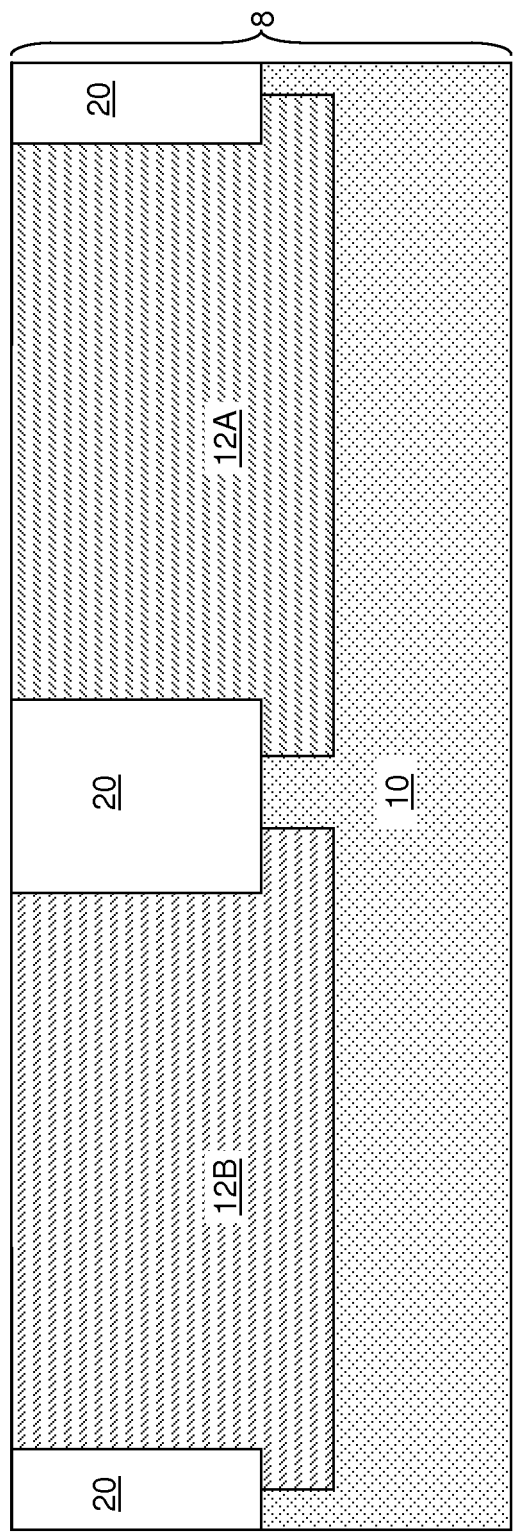
FIG. 1 is vertical cross-sectional view of a first exemplary semiconductor structure after formation of various doped wells and shallow trench isolation structures according to a first embodiment of the present disclosure.

As stated above, the present disclosure relates to semiconductor structures including a field effect transistor with a composite high-k gate dielectric stack, and methods of manufacturing the same. Aspects of the present disclosure are now described in detail with accompanying figures. Like and corresponding elements mentioned herein and illustrated in the drawings are referred to by like reference numerals. The drawings are not necessarily drawn to scale.

Referring to FIG. 1, a first exemplary semiconductor structure according to a first embodiment of the present disclosure includes a semiconductor substrate 8, on which various components of field effect transistors are formed. As used herein, a field effect transistor refers to any planar transistor having a gate electrode overlying a horizontal planar channel, any fin field effect transistor having a gate electrode located on sidewalls of a semiconductor fin, or any other types of metal-oxide semiconductor field effect transistor (MOSFETs) and junction field effect transistors (JFETs). The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include an underlying semiconductor layer 10, a first doped well 12A formed in a first device region (the region to the right in FIG. 1), and an second doped well 12B formed in a second device region (the region to the left in FIG. 1). Each of the first doped well 12A and the second doped well 12B can be independently doped with n-type electrical dopants or p-type electrical dopants. Thus, each of the first doped well 12A and the second doped well 12B can be an n-type well or a p-type well. In one embodiment, the first doped well 12A and the second doped well can have opposite types of doping.

Shallow trench isolation structures 20 are formed to laterally separate each of the second doped well 12B and the first doped well 12A. In one embodiment, each of the second doped well 12B and the first doped well 12A is laterally surrounded by a contiguous portion of the shallow trench isolation structures 20. If the semiconductor substrate 8 is a semiconductor-on-insulator substrate, bottom surfaces of the second doped well 12B and the first doped well 12A may contact a buried insulator layer (not shown), which electrically isolates each of the second doped well 12B and the first doped well 12A from other semiconductor portions of the semiconductor substrate 8 in conjunction with the shallow trench isolation structures 20.

Figure 2:
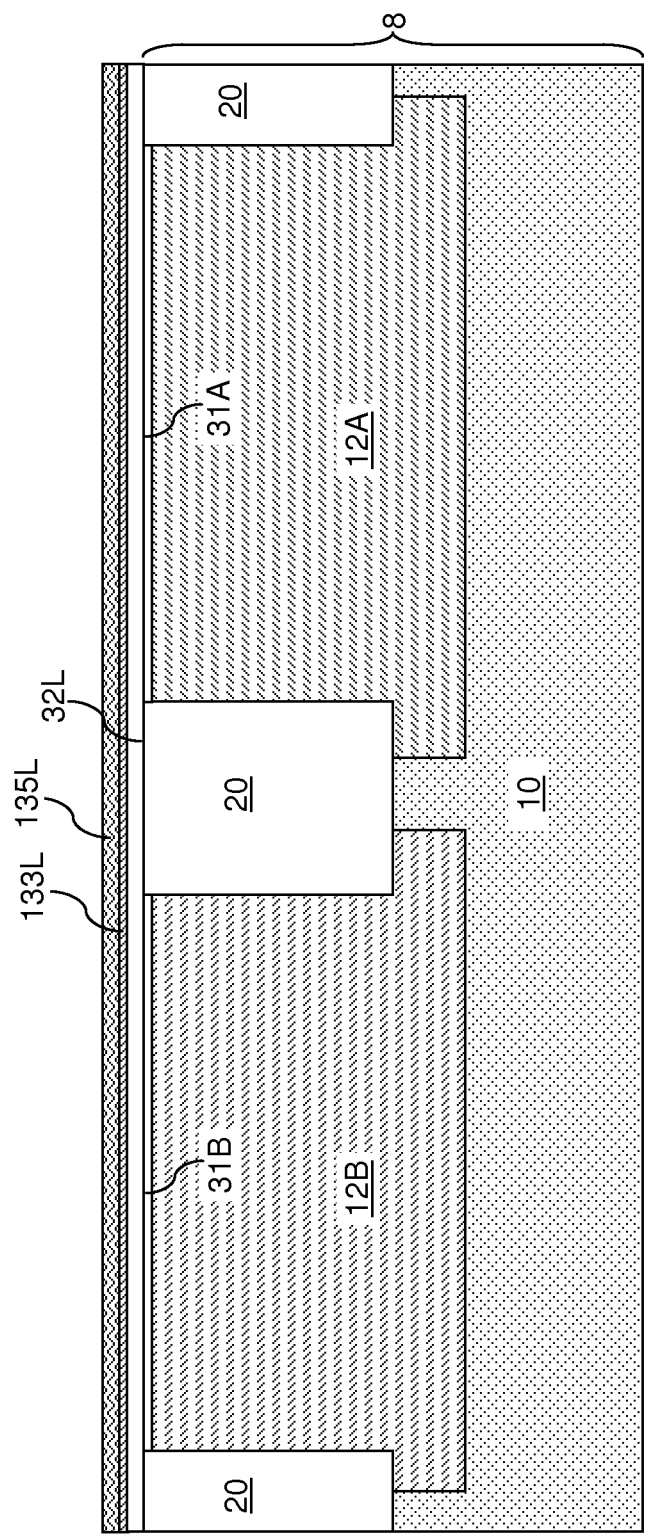
FIG. 2 is a vertical cross-sectional view of the first exemplary semiconductor structure after formation of a first dopant metal layer and a first disposable capping material layer according to the first embodiment of the present disclosure.

Referring to FIG. 2, a first interfacial dielectric 31A can be optionally formed on the exposed surface of the first doped well 12A by conversion of the exposed semiconductor material into a dielectric material, and a second interfacial dielectric 31B can be formed on the exposed surface of the second doped well 12B by conversion of the exposed semiconductor material into the dielectric material. Each of the first and second interfacial dielectrics (31A, 31B) can be a semiconductor-element-containing dielectric layer. The formation of the interfacial dielectrics (31A, 31B) can be effected by thermal conversion or plasma treatment. If the semiconductor material of the first doped well 12A and the second doped well 12B includes silicon, the interfacial dielectrics (31A, 31B) can include silicon oxide or silicon oxynitride. In one embodiment, the first interfacial dielectric 31A and the second interfacial dielectric 31B can have a same composition and a same thickness. The thickness of the interfacial dielectrics (31A, 31B) can be from 0.1 nm to 0.5 nm, although lesser and greater thicknesses can also be employed.

A first high dielectric constant (high-k) dielectric material layer 32L can be subsequently deposited over the semiconductor substrate 8. The first high-k dielectric material layer 32L includes a first high-k dielectric material having a dielectric constant greater than 3.9. All dielectric constants are measured in vacuum unless otherwise specified. In one embodiment, the first high-k dielectric material can include a dielectric metal oxide. Exemplary materials that can be employed for the first high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the first high-k dielectric material can be selected from $HfO_2$, $ZrO_2$, and $TiO_2$. In one embodiment, the first high-k dielectric material can be $HfO_2$.

The thickness of the first high-k dielectric material layer 32L can be from 0.6 nm to 6 nm, although lesser and greater thicknesses can also be employed. In one embodiment, the first high-k dielectric material layer 32L may have an effective oxide thickness on the order of or less than 2 nm. The first high-k dielectric material can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The first high-k dielectric material layer 32L is formed as a planar layer that does not include a sidewall over a top surface of the semiconductor substrate 8.

A first dopant metal layer 133L and a first disposable capping material layer 135L are formed on the first high-k dielectric material layer 32L. The first dopant metal layer 133L includes a first dopant metal, which can dope the first high-k dielectric material to alter the band gap of the first high-k dielectric material. In one embodiment, the first dopant metal can be at least one rare-earth metal such as La. In another embodiment, the first dopant metal can be Al, Ga, or In.

The first dopant metal layer 133L can include less than one atomic monolayer of the first dopant metal, one monolayer of the first dopant metal, or more than one monolayer of the first dopant metal. As used herein, a "layer" refers to any layer having a thickness of less than one atomic layer, a thickness of one atomic layer, or a thickness of more than one atomic layer. The thickness of the first dopant metal layer 133L can be from 0.1 nm to 0.8 nm, although lesser and greater thicknesses can also be employed. The first dopant metal layer 133L can be formed, for example, by physical vapor deposition (PVD).

The first dopant metal layer 133L is formed as a planar layer that does not include a sidewall over the top surface of the semiconductor substrate 8. The first dopant metal layer 133L is formed on the entirety of the top surface of the first high-k dielectric material layer 32L. Specifically, the first dopant metal layer 133L is formed directly on the top surface of a first portion of the first high-k dielectric material layer 32L that overlies the first doped well 12A, and directly on the top surface of a second portion of the first high-k dielectric material layer 32L that overlies the second doped well 12B. The first dopant metal layer 133L can include at least one of an alkaline earth metal, a transition metal, a group IIIA metal, and a rare earth metal. In one embodiment, the first dopant metal layer 133L can consist essentially of an elemental metal selected from an alkaline earth metal, a transition metal, a group IIIA metal, and a rare earth metal. In one embodiment, the elemental metal within the first dopant metal layer 133L can be selected from among elemental metals that are not present in the first high-k dielectric material layer 32L. For example, the first dopant metal layer 133L can include Mg, La, and/or Al.

The first disposable capping material layer 135L includes a material that can be removed selective to the first high-k dielectric material of the first high-k dielectric material layer 32L. In one embodiment, the first disposable capping material layer 135L can include a metallic nitride, a metal, a semiconductor material, or a stack thereof. In one embodiment, the first disposable capping material layer 135L can include at least one metallic nitride layer. For example, the first disposable capping material layer 135L can include titanium nitride, or a stack of a first titanium nitride layer, a metal layer, and a second titanium nitride layer. The first disposable capping material layer 135L can be formed, for example, by physical vapor deposition (PVD) or chemical vapor deposition (CVD). The thickness of the first disposable capping material layer 135L can be from 1 nm to 20 nm, although lesser and greater thicknesses can also be employed. The first disposable capping material layer 135L can be deposited as a planar layer over the entirety of the top surface of the first dopant metal layer 133L.

Figure 3:
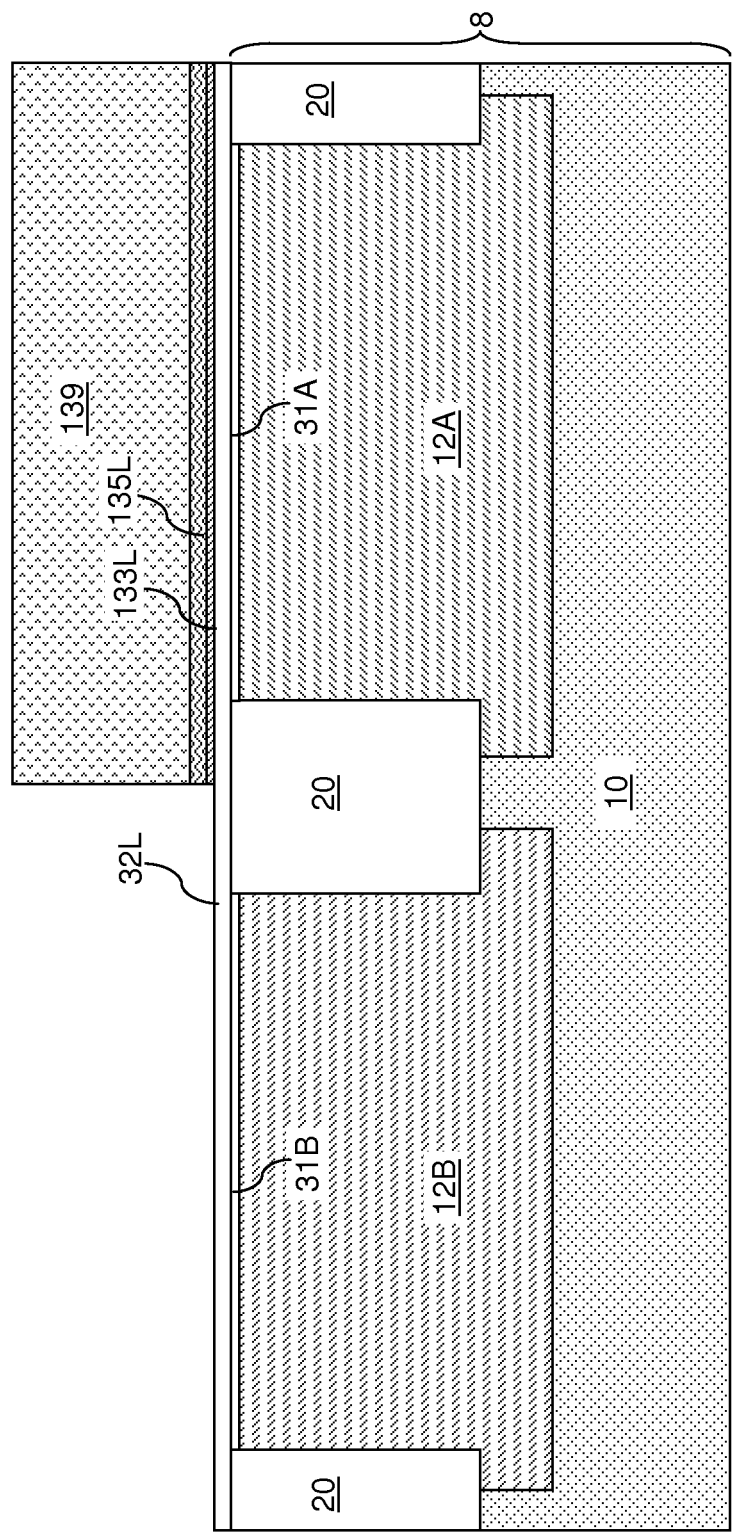
FIG. 3 is a vertical cross-sectional view of the first exemplary semiconductor structure after patterning of the first disposable capping material layer and the first dopant metal layer according to the first embodiment of the present disclosure.

Referring to FIG. 3, a photoresist layer 139 can be applied over the first disposable capping material layer 135L. The photoresist layer 139 can be lithographically patterned to cover the first portion of the first high-k dielectric material layer 32L that overlies the first doped well 12A, and to physically expose the second portion of the first high-k dielectric material layer 32L that overlies the second doped well 12B. A sidewall of the photoresist layer 139 can be located over a portion of the shallow trench isolation structures 20 located between the first doped well 12A and the second doped well 12B.

The portions of the first disposable capping material layer 135L and the first dopant metal layer 133L that are not covered by the photoresist layer 139 is subsequently removed by an etch, which employs the photoresist layer 139 as an etch mask. The first disposable capping material layer 135L and the first dopant metal layer 133L are removed from above the second portion of the first high-k dielectric material layer 32L that overlies the second doped well 12B, while the first disposable capping material layer 135L and the first dopant metal layer 133L are not removed from above the first portion of the first high-k dielectric material layer 32L that overlies the first doped well 12A. The first disposable capping material layer 135L and the first dopant metal layer 133L can be sequentially removed from above the second portion of the first high-k dielectric material layer 32L. The removal of portions of the first disposable capping material layer 135L and the first dopant metal layer 133L can be removed, for example, by a wet etch. The photoresist layer 139 is subsequently removed, for example, by ashing.

Figure 4:
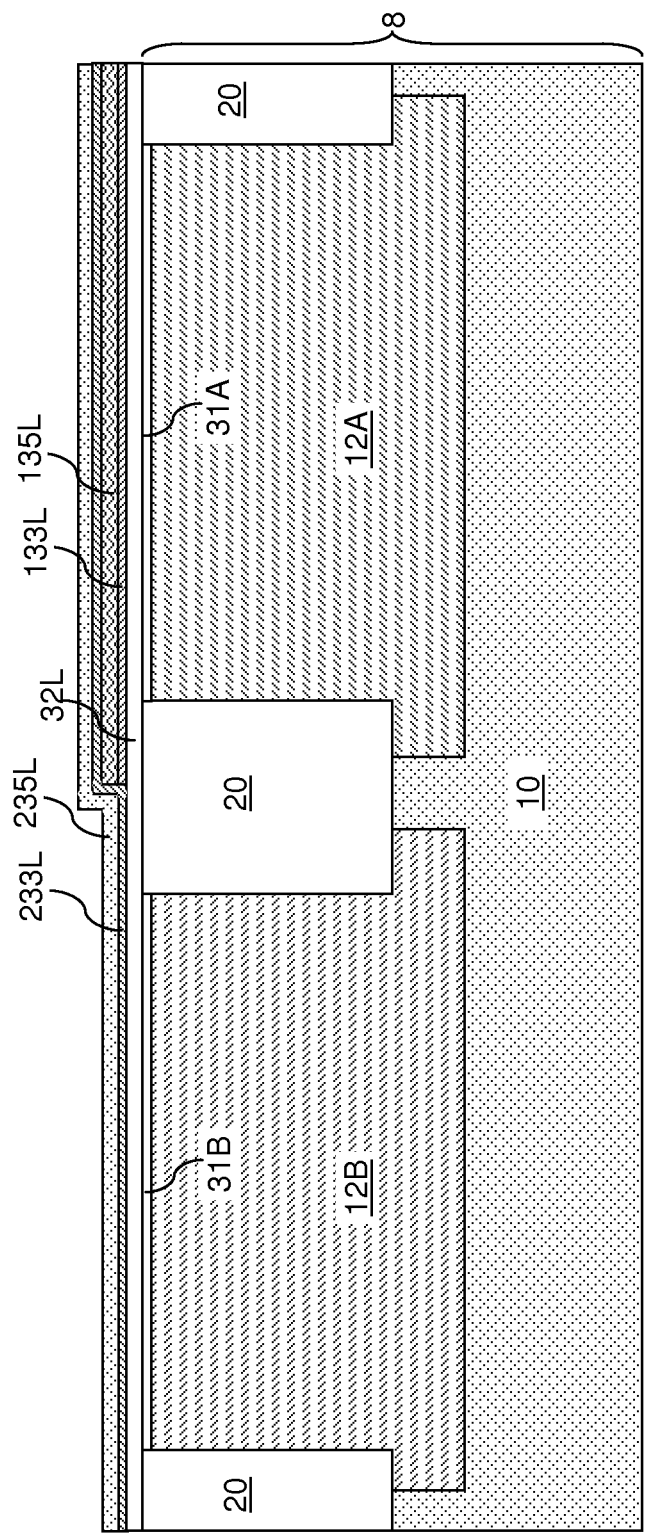
FIG. 4 is a vertical cross-sectional view of the first exemplary semiconductor structure after deposition of a second dopant metal layer and a second disposable capping material layer according to the first embodiment of the present disclosure.

Referring to FIG. 4, a second dopant metal layer 233L and a second disposable capping material layer 235L are subsequently deposited. The second dopant metal layer 233L is deposited directly on the second portion of the first high-k dielectric material layer 32L overlying the second doped well 12B and directly on a sidewall and a top surface of the first disposable capping material layer 135L that is present over the first doped well 12A.

The second dopant metal layer 233L includes at least one second dopant metal, which can dope the first high-k dielectric material to alter the band gap of the first high-k dielectric material in a manner different from the first dopant metal. The second dopant metal layer 233L can include at least one of an alkaline earth metal, a transition metal, a group IIIA metal, and a rare earth metal. In one embodiment, the second dopant metal layer 2133L can consist essentially of an elemental metal selected from an alkaline earth metal, a transition metal, a group IIIA metal, and a rare earth metal. In one embodiment, the at least one elemental metal within the second dopant metal layer 233L can be selected from among elemental metals that are not present in the first high-k dielectric material layer 32L. Further, the at least one elemental metal within the second dopant metal layer 233L can be selected to be different from the first dopant metal. In one embodiment, if the first dopant metal includes at least one rare-earth metal such as La, the second dopant metal can be selected from alkaline earth metal elements (e.g., Mg, Ca, and Sr) and/or from Group IIIA elements (e.g., Al, Ga, and In). If the first dopant metal includes a Group IIIA element, the second dopant metal can be at least one rare-earth metal and/or at least one alkaline earth metal such as Mg. If the first dopant metal includes an alkaline earth metal, the second dopant metal can include at least one rare earth metal or Group IIA elements.

The second dopant metal layer 233L can include less than one atomic monolayer of the second dopant metal, one monolayer of the second dopant metal, or more than one monolayer of the second dopant metal. The second dopant metal layer 233L can be formed, for example, by physical vapor deposition (PVD). The second dopant metal layer 233L is formed as a blanket layer that contiguously extends over the entirety of the top surface of the semiconductor substrate 8, and does not include a hole therein.

The second disposable capping material layer 235L includes a material that can be removed selective to the first high-k dielectric material of the first high-k dielectric material layer 32L. In one embodiment, the second disposable capping material layer 235L can include a metallic nitride, a metal, a semiconductor material, or a stack thereof. In one embodiment, the second disposable capping material layer 235L can include at least one metallic nitride layer. For example, the second disposable capping material layer 235L can include titanium nitride, or a stack of a first titanium nitride layer, a metal layer, and a second titanium nitride layer. The second disposable capping material layer 235L can include the same material as, or can include a material different from, the material(s) of the first disposable capping material layer 135L. The second disposable capping material layer 235L can be formed, for example, by physical vapor deposition (PVD) or chemical vapor deposition (CVD). The thickness of the second disposable capping material layer 235L can be from 1 nm to 20 nm, although lesser and greater thicknesses can also be employed. The second disposable capping material layer 235L can be deposited as a blanket layer over the entirety of the top surface of the second dopant metal layer 233L.

Figure 5:
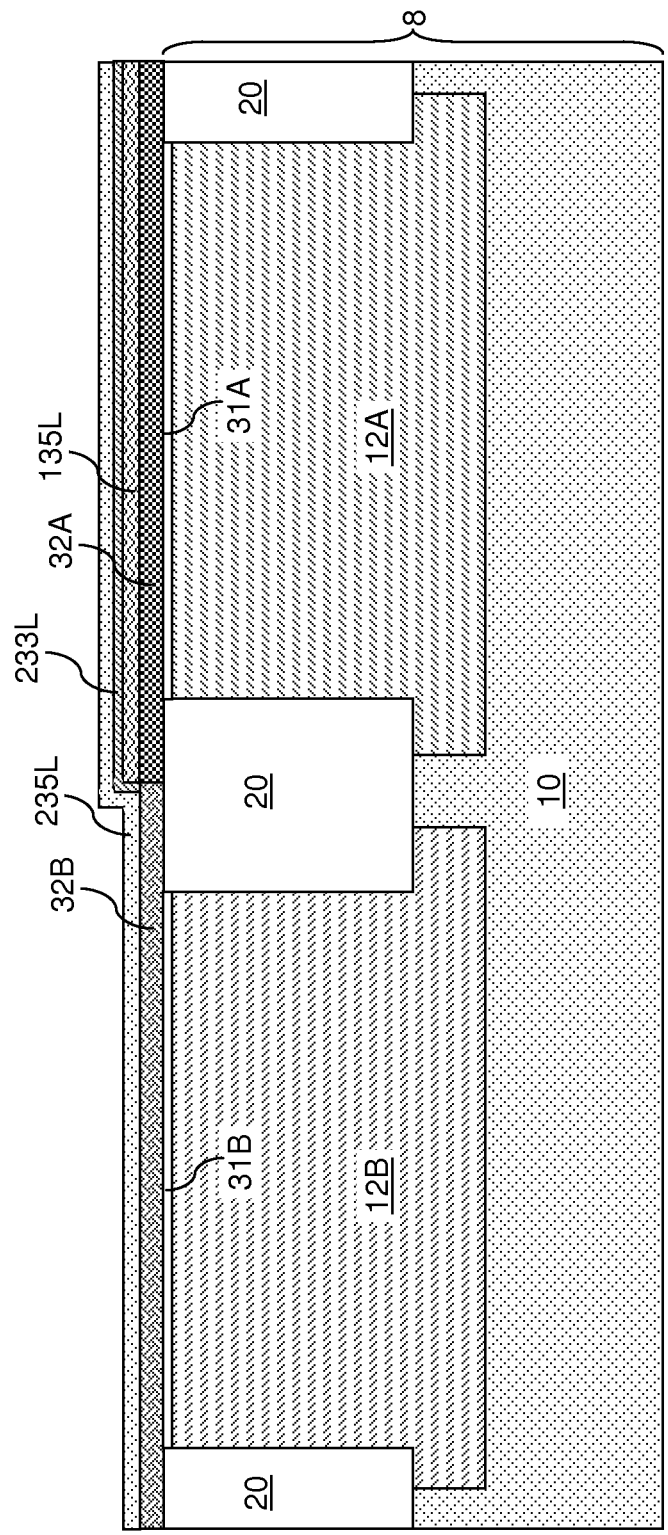
FIG. 5 is a vertical cross-sectional view of the first exemplary semiconductor structure after performing an anneal that forms a first doped high-k gate dielectric layer and a second doped high-k gate dielectric layer according to the first embodiment of the present disclosure.

Referring to FIG. 5, an anneal can be performed at an elevated temperature to form a first doped high-k gate dielectric layer 32A and a second doped high-k gate dielectric layer 32B. The temperature of the anneal can be selected as a temperature at which the materials of the first dopant metal layer 133L and the second dopant metal layer 233L diffuse into underlying portions of the first high-k dielectric material layer. For example, the temperature of the anneal can be in a range from 400° C. to 1,000° C., although lesser and greater temperatures can also be employed.

During the anneal, the material of the first dopant metal layer 133L and the material of the first portion of the first high-k dielectric layer 32L overlying the first doped well 12A interdiffuse into each other, and form the first doped high-k gate dielectric layer 32A. The first doped high-k gate dielectric layer 32A includes the first high-k dielectric material of the first high-k dielectric layer 32L and the first dopant metal of the first dopant metal layer 133L. Likewise, the material of the second dopant metal layer 233L and the material of the second portion of the first high-k dielectric layer 32L overlying the second doped well 12B interdiffuse into each other during the anneal, and form the second doped high-k gate dielectric layer 32B. The second doped high-k gate dielectric layer 32B includes the first high-k dielectric material of the first high-k dielectric layer 32L and the second dopant metal of the second dopant metal layer 233L.

Figure 6:
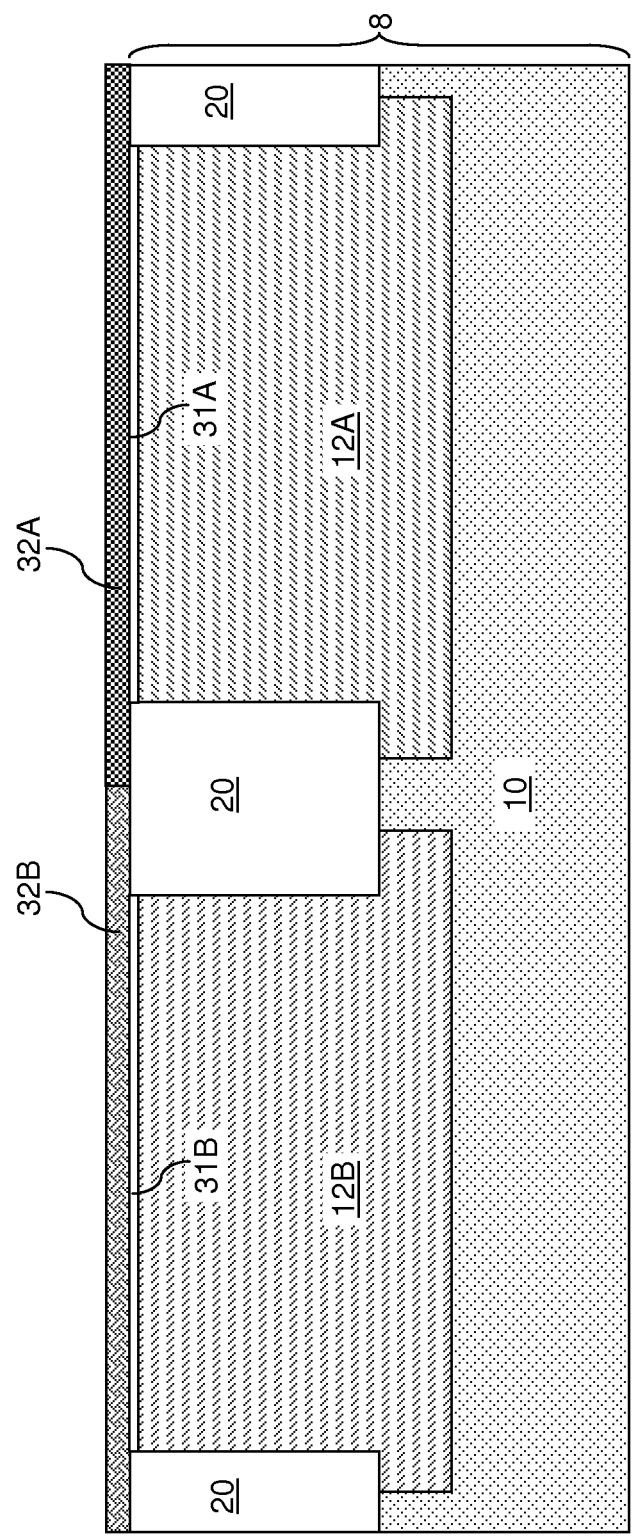
FIG. 6 is a vertical cross-sectional view of the first exemplary semiconductor structure after removal of the second disposable capping material layer, the second dopant metal layer, and the first disposable capping material layer according to the first embodiment of the present disclosure.

Referring to FIG. 6, the second disposable capping material layer 235L, an unreacted portion of the second dopant metal layer 233L overlying the first disposable capping material layer 135L, and the first disposable capping material layer 133L are sequentially removed selective to the materials of the first doped high-k gate dielectric layer 32A and the second doped high-k gate dielectric layer 32B. The first disposable capping material layer 133L is removed from above the first doped high-k gate dielectric layer 31A. In one embodiment, the second disposable capping material layer 235L and the first disposable capping material layer 135L include a metallic nitride such as TiN, and the etch chemistry employed to remove the second disposable capping material layer 235L and the first disposable capping material layer 135L can be an etch chemistry that removes a metallic material selective to dielectric materials.

The first doped high-k gate dielectric layer 32A and the second doped high-k gate dielectric layer 32B can have the same thickness. The first dopant metal can be present in the first doped high-k gate dielectric layer 32A, and can be absent in the second doped high-k gate dielectric layer 32B. The second dopant metal can be present in the second doped high-k gate dielectric layer 32B, and can be absent in the first doped high-k gate dielectric layer 32A.

Figure 7:
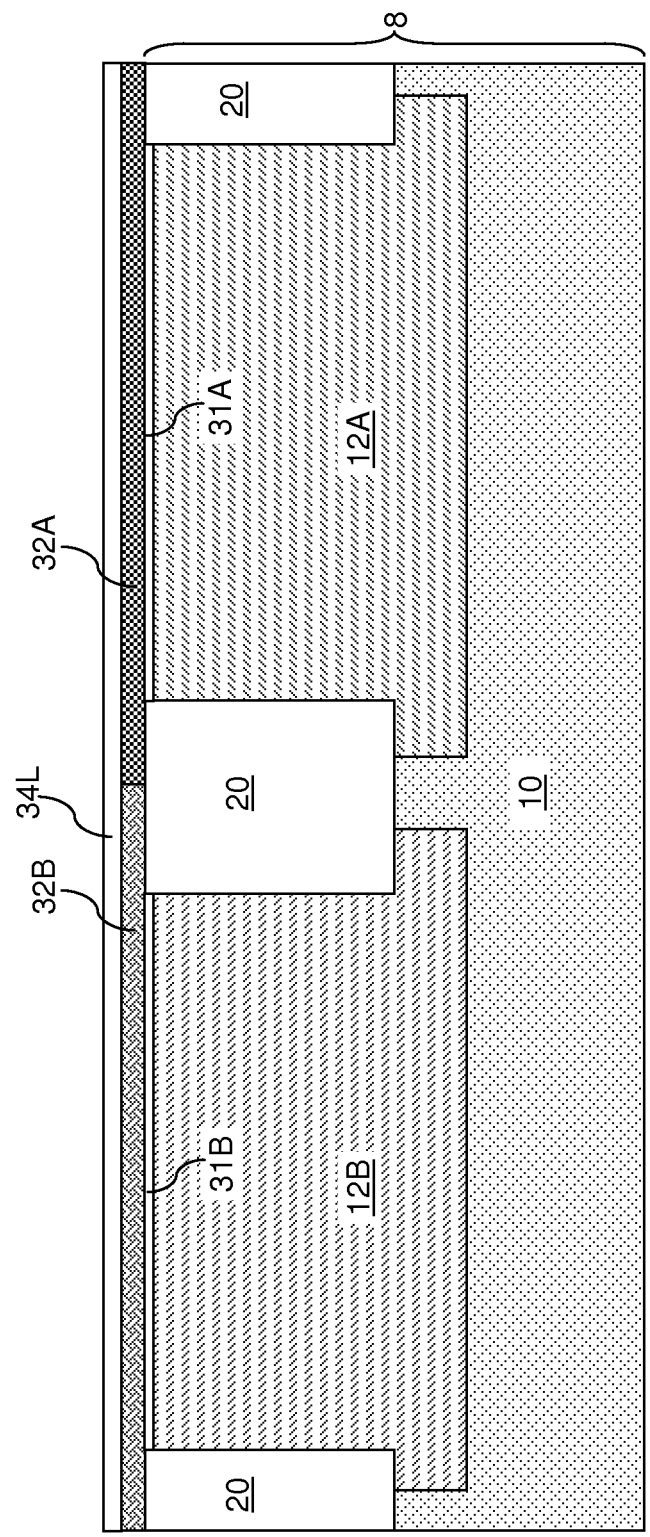
FIG. 7 is a vertical cross-sectional view of the first exemplary semiconductor structure after formation of a second high-k dielectric material layer according to the first embodiment of the present disclosure.

Referring to FIG. 7, a second high-k dielectric material layer 34L can be deposited over the first doped high-k gate dielectric layer 32A and the second doped high-k gate dielectric layer 32B. The second high-k dielectric material layer includes an undoped high-k dielectric material that does not include the first dopant metal or the second dopant metal.

The second high-k dielectric material layer 34L includes a second high-k dielectric material having a dielectric constant greater than 3.9. The second high-k dielectric material can be the same as, or different from, the first high-k dielectric material. In one embodiment, the second high-k dielectric material can include a dielectric metal oxide. Exemplary materials that can be employed for the second high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the second high-k dielectric material can be selected from $HfO_2$, $ZrO_2$, and $TiO_2$. In one embodiment, the first and second high-k dielectric materials can be the same, and can be selected from $HfO_2$, $ZrO_2$, and $TiO_2$.

The thickness of the second high-k dielectric material layer 34L can be from 0.1 nm to 2.0 nm, although lesser and greater thicknesses can also be employed. In one embodiment, the second high-k dielectric material layer 34L may have an effective oxide thickness on the order of or less than 2 nm. The second high-k dielectric material can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. The second high-k dielectric material layer 34L can be formed as a planar layer that does not include a sidewall over top surfaces of the first doped high-k gate dielectric layer 32A and the second doped high-k gate dielectric layer 32B.

Figure 8:
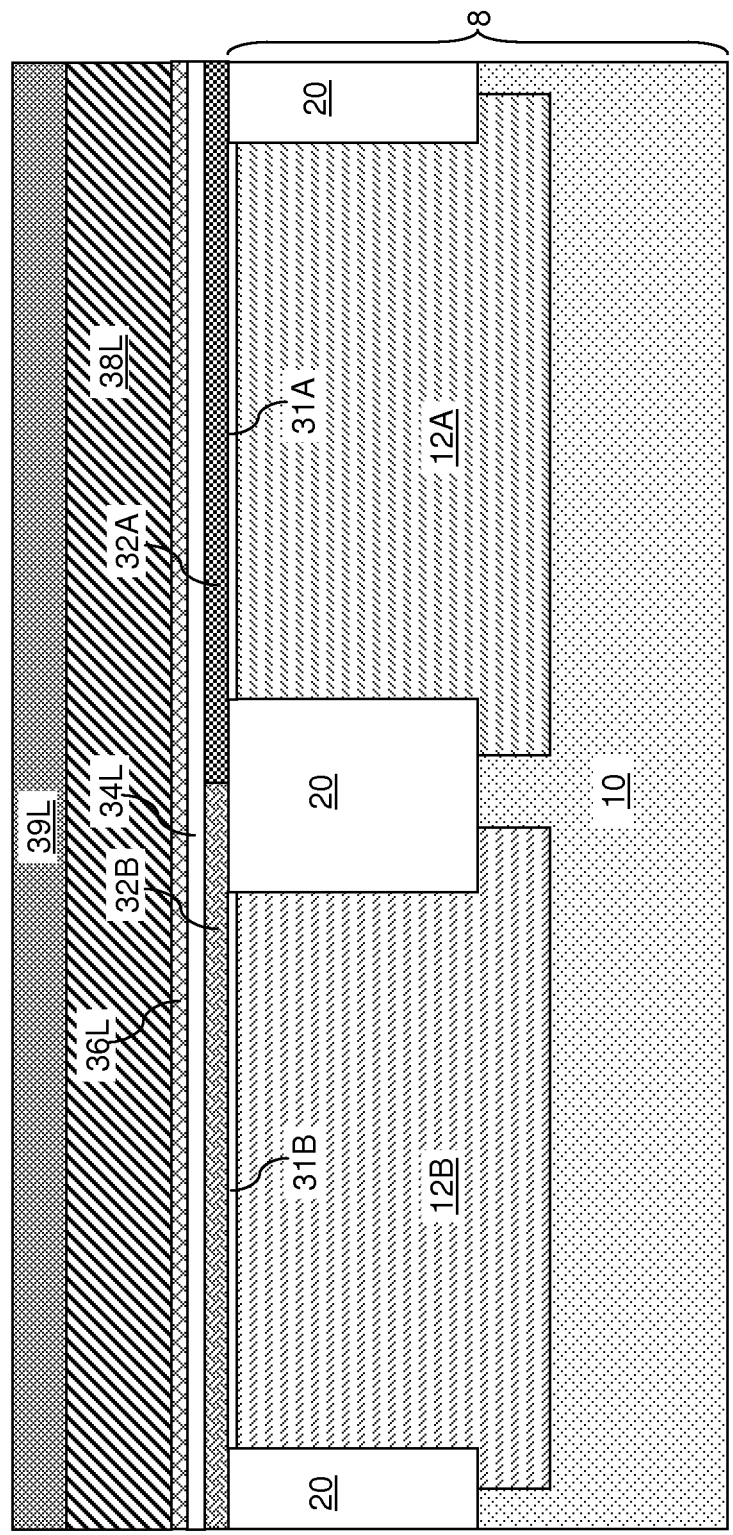
FIG. 8 is a vertical cross-sectional view of the first exemplary semiconductor structure after formation of a gate conductor layer and a gate cap layer according to the first embodiment of the present disclosure.

Referring to FIG. 8, an optional work function material layer 36L, a gate conductor layer 38L, and a gate cap layer 39L can be sequentially deposited over the second high-k dielectric material layer 34L.

The material of the optional work function material layer 36L can be selected from any work function material known in the art. The optional work function material layer 36L can include an elemental only, or can include a metallic compound, which includes a metal and a non-metal element. The metallic compound is selected to optimize the performance of the field effect transistors to be subsequently formed. In one embodiment, the metallic compound can be selected from tantalum carbide, metallic nitrides, and a hafnium-silicon alloy. Exemplary metallic nitrides include titanium nitride, tantalum nitride, tungsten nitride, and combinations and alloys thereof.

The optional work function material layer 36L can be formed, for example, by physical vapor deposition, chemical vapor deposition, or atomic layer deposition (ALD). The thickness of the optional work function material layer 36L can be in a range from 1 nm to 30 nm, although lesser and greater thicknesses can also be employed.

The gate conductor layer 38L can be deposited on the optional work function material layer 36L, or on the second high-k dielectric material layer 34L. The gate conductor layer 38L includes a conductive material such as a metallic material or a doped semiconductor material. For example, the gate conductor layer 38L can include a metallic layer such as an aluminum layer, a tungsten layer, an aluminum alloy layer, or a tungsten alloy layer, and can be deposited by physical vapor deposition. Additionally or alternately, the gate conductor layer 38L can include a doped semiconductor layer, which can be formed with in-situ doping, or can be deposited as an intrinsic semiconductor material and subsequently doped with a p-type dopant or an n-type dopant. The thickness of the gate conductor layer 38L can be from 100 nm to 500 nm, although lesser and greater thicknesses can also be employed.

The gate cap layer 39L can include a dielectric material such as silicon nitride, silicon oxide, silicon oxynitride, or a combination thereof. The gate cap layer 39L can be deposited, for example, by chemical vapor deposition. The thickness of the gate cap layer 39L can be from 10 nm to 100 nm, although lesser and greater thicknesses can also be employed.

Figure 9:
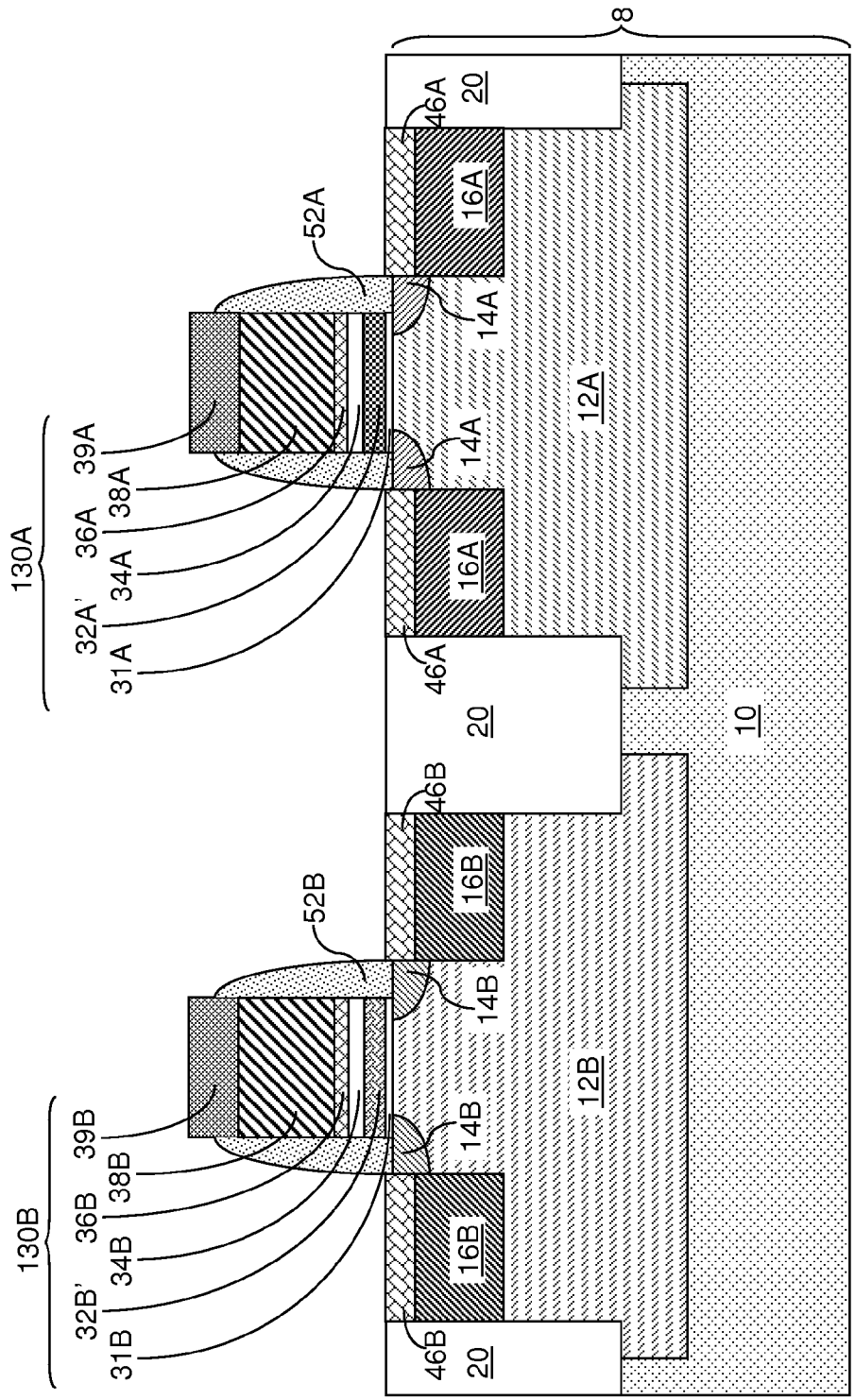
FIG. 9 is a vertical cross-sectional view of the first exemplary semiconductor structure after patterning of gate structures, formation of source and drain extension regions and source and drain regions, and metal semiconductor alloy portions according to the first embodiment of the present disclosure.

Referring to FIG. 9, gate structures can be formed by patterning of the gate stack layers including, from bottom to top, of the first and second interfacial dielectrics (31A, 31B), the first and second doped high-k gate dielectric layers (32A, 32B), the second high-k dielectric material layer 34L, the optional work function material layer 36L, the gate conductor layer 38L, and the gate cap layer 39L.

A first gate stack 130A can be formed over the first doped well 12A. The first gate stack 130A includes, from bottom to top, a remaining portion of the first interfacial dielectric 31A, a remaining portion of the first doped high-k gate dielectric layer 32A (which is herein referred to as a first doped high-k gate dielectric 32A'), a first remaining portion of the second high-k dielectric material layer 34L (which is herein referred to as a first undoped high-k gate dielectric 34A), a first remaining portion of the optional work function material layer 36L (which is herein referred to as an optional first work function material portion 36A), a first remaining portion of the gate conductor layer 38L (which is herein referred to as a first gate conductor portion 38A), and a first remaining portion of the gate cap layer 39L (which is herein referred to as a first gate cap portion 39A).

A second gate stack 130B can be formed over the second doped well 12B. The second gate stack 130B includes, from bottom to top, a remaining portion of the second interfacial dielectric 31B, a remaining portion of the second doped high-k gate dielectric layer 32B (which is herein referred to as a second doped high-k gate dielectric 32B'), a second remaining portion of the second high-k dielectric material layer 34L (which is herein referred to as a second undoped high-k gate dielectric 34B), a second remaining portion of the optional work function material layer 36L (which is herein referred to as an optional second work function material portion 36B), a second remaining portion of the gate conductor layer 38L (which is herein referred to as a second gate conductor portion 38B), and a second remaining portion of the gate cap layer 39L (which is herein referred to as a second gate cap portion 39B).

Various source extension regions and drain extension regions can be subsequently formed by ion implantation employing the first gate stack 130A and/or the second gate stack 130B as a part of an implantation mask. Patterned photoresist layers (not shown) can be employed to cover the first doped well 12A or the second doped well 12B during ion implantation steps for forming the various source extension regions and drain extension regions (which are collectively referred to source and drain extension regions). The various source and drain extension regions can include first source and drain extension regions 14A formed within the first doped well 12A, and second source and drain extension regions 14B formed within the second doped well 12B.

Dielectric gate spacers can be formed on the sidewalls of the first and second gate stacks (130A, 130B). The dielectric gate spacers can include a dielectric material such as silicon oxide, silicon nitride, silicon oxynitride, and can be formed by depositing a conformal dielectric material layer and subsequently removing horizontal portions of the conformal dielectric material layer by an anisotropic etch. Remaining vertical portions of the conformal dielectric material layer constitute the dielectric gate spacers, which can include a first dielectric gate spacer 52A laterally contacting the first gate stack 130A and a second dielectric gate spacer 52B laterally contacting the second gate stack 130B.

Various source regions and drain regions can be subsequently formed by ion implantation employing the dielectric gate spacers (52A, 52B), the first gate stack 130A, and/or the second gate stack 130B as a part of an implantation mask. Patterned photoresist layers (not shown) can be employed to cover the first doped well 12A or the second doped well 12B during ion implantation steps for forming the various source regions and drain regions (which are collectively referred to source and drain regions). The various source and drain regions can include first source and drain regions 14A formed within the first doped well 12A, and second source and drain regions 14B formed within the second doped well 12B.

Various metal semiconductor alloy portions can be formed, for example, by depositing a metal layer on semiconductor surfaces, and by reacting the metal layer with the underlying semiconductor material in an anneal at an elevated temperature. First metal semiconductor alloy portions 46A can be formed on the first source and drain regions 14A, and second metal semiconductor alloy portions 46B can be formed on the second source and drain regions 14B. Unreacted portions of the metal layer can be removed selective to the various metal semiconductor alloy portions (46A, 46B).

The first exemplary semiconductor structure of FIG. 9 includes a first field effect transistor having a first gate dielectric (31A, 32A', 34A) and a second field effect transistor having a second gate dielectric (31B, 32B', 34B). The first gate dielectric (31A, 32A', 34A) includes the first doped high-k gate dielectric 32A', which includes the first high-k dielectric material having a dielectric constant greater than 3.9 and is doped with the first dopant metal. The first gate dielectric (31A, 32A', 34A) further includes the first undoped high-k gate dielectric 34A, which includes the second high-k gate dielectric material. The second gate dielectric (31B, 32B', 34B) includes the second doped high-k gate dielectric 32B', which includes the first high-k dielectric material and is doped with the second dopant metal that is different from the first dopant metal. The second gate dielectric (31B, 32B', 34B) further includes the second undoped high-k gate dielectric 34B, which includes the second high-k gate dielectric material.

In one embodiment, the first doped high-k gate dielectric 32A' and the second doped high-k gate dielectric 32B' can have the same thickness, which is herein referred to as a first thickness. In one embodiment, the first undoped high-k gate dielectric 34A and the second undoped high-k gate dielectric 34B have a same second thickness, which is herein referred to as a second thickness.

In one embodiment, the first doped high-k gate dielectric 32A' does not include the second dopant metal, and the second doped high-k gate dielectric 32B' does not include the first dopant metal. In one embodiment, each of the first and second undoped high-k gate dielectric (34A, 34B) can consist of the second high-k gate dielectric material.

In one embodiment, each of the first doped high-k gate dielectric 32A', the first undoped high-k gate dielectric 34A, the second doped high-k gate dielectric 32B', and the second undoped high-k gate dielectric 34B can be a planar layer having a same thickness throughout.

In one embodiment, the first gate dielectric (31A, 32A', 34A) can include the first interfacial dielectric 31A contacting the channel of the first field effect transistor and the first doped high-k gate dielectric 34A, and the second gate dielectric (31B, 32B', 34B) can include the second interfacial dielectric 31B contacting the channel of the second field effect transistor and the second doped high-k gate dielectric 34B.

In one embodiment, each of the first high-k dielectric material and the second high-k gate dielectric material can be selected from $HfO_2$, $ZrO_2$, and $TiO_2$. In one embodiment, the first high-k dielectric material can be the same as the second high-k gate dielectric material. In one embodiment, the first dopant metal can be selected from rare earth elements, and the second dopant metal can be selected from Al, Ga, and In.

Figure 10:
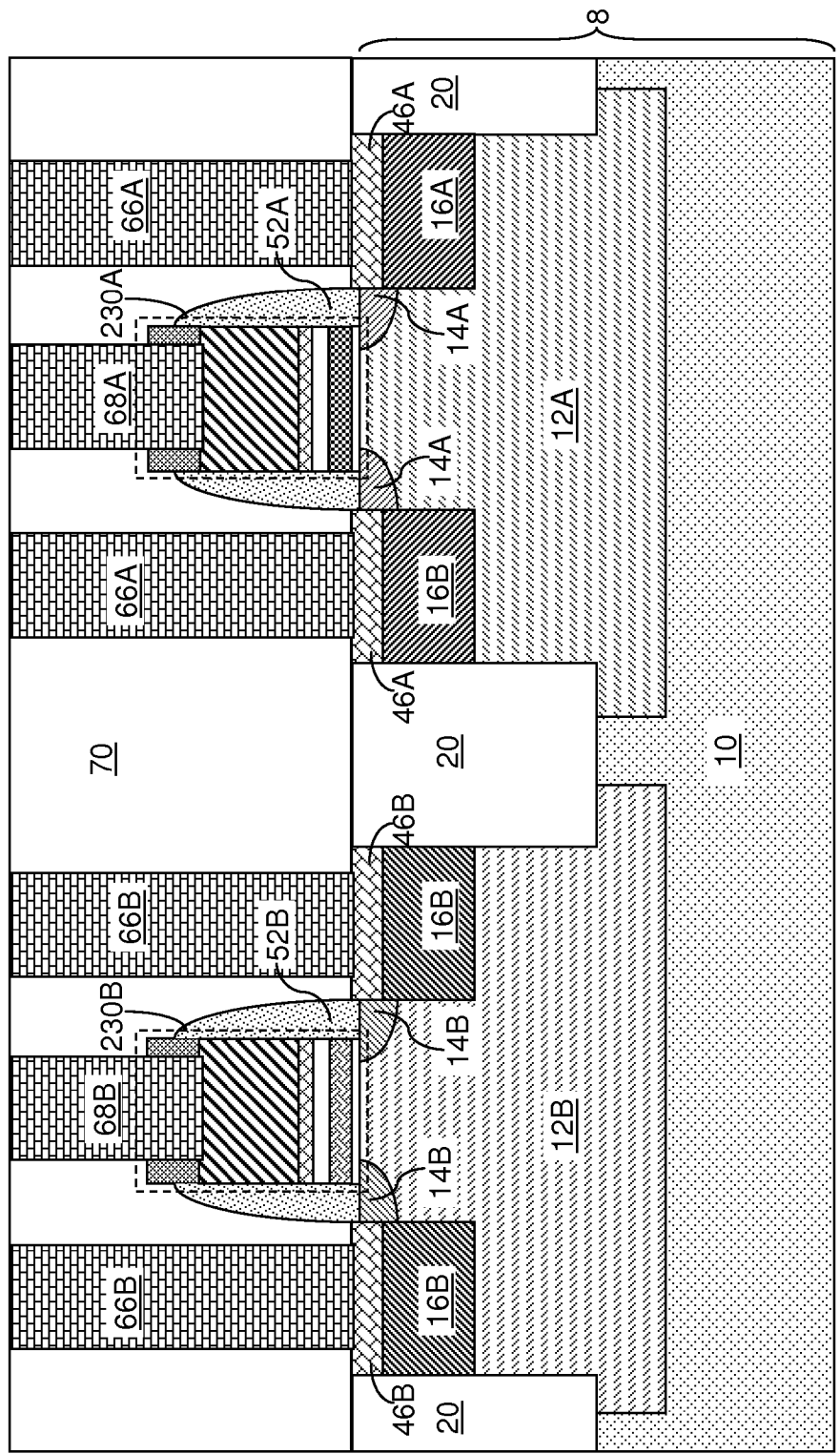
FIG. 10 is a vertical cross-sectional view of the first exemplary semiconductor structure after formation of a contact-level dielectric layer and formation of various contact via structures according to the first embodiment of the present disclosure.

Referring to FIG. 10, a contact-level dielectric layer 70 can be deposited over semiconductor substrate 8 and the first and second gate stacks (130A, 130B). Various contact via structures can be formed, for example, by formation of contact via cavities by a combination of lithographic patterning and an anisotropic etch followed by deposition of a conductive material and planarization that removes an excess portion of the conductive material from above the contact-level dielectric layer 70. The various contact via structures can include, for example, first source/drain contact via structures 66A, second source/drain contact via structures 66B, a first gate contact via structure 68A, and a second gate contact via structure 68B.

Figure 11:
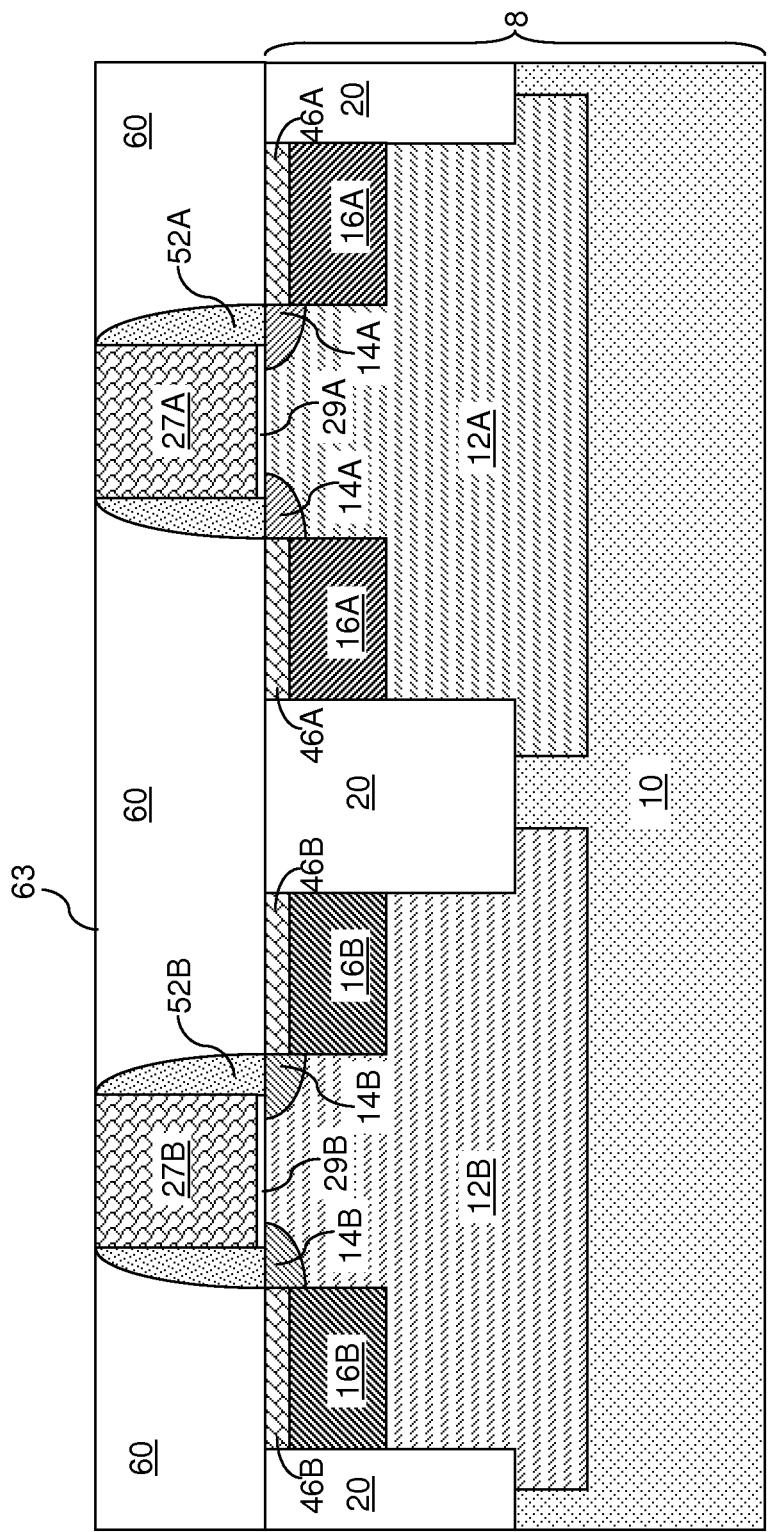
FIG. 11 is a vertical cross-sectional view of a second exemplary semiconductor structure after formation of disposable gate structures, dielectric gate spacers, and a planarization dielectric layer according to a second embodiment of the present disclosure.

Referring to FIG. 11, a second exemplary semiconductor structure according to a second embodiment of the present disclosure can be derived from the first exemplary semiconductor structure of FIG. 1 by forming structures for a replacement gate integration scheme. Specifically, a disposable dielectric layer and a disposable gate material layer can be deposited and lithographically patterned to form disposable gate structures. For example, the disposable gate stacks may include a first disposable gate structure that is a stack of a first disposable dielectric portion 29A and a first disposable gate material portion 27A and a second disposable gate structure that is a stack of a second disposable dielectric portion 29B and a second disposable gate material portion 27B. The disposable dielectric layer includes a dielectric material such as a semiconductor oxide. The disposable gate material layer includes a material that can be subsequently removed selective to dielectric material such as a semiconductor material. The first disposable gate structure (29A, 27A) is formed over the first doped well 12A, and the second disposable gate structure (29B, 27B) is formed over the second doped well 12B. The height of the first disposable gate structure (29A, 27A) and the second disposable gate structure (29B, 27B) can be from 20 nm to 500 nm, and typically from 40 nm to 250 nm, although lesser and greater heights can also be employed.

First electrical dopants can be implanted into portions of the first doped well 12A that are not covered by the first disposable gate structure (29A, 27A) to form first source and drain extension regions 14A. The second doped well 12B can be masked by a photoresist (not shown) during the implantation of the first electrical dopants to prevent implantation of the first electrical dopants therein. In one embodiment, the first electrical dopants have the opposite polarity of the polarity of doping of the first doped well 12A. For example, the first doped well 12A can be a p-type well and the first electrical dopants can be n-type dopants such as P, As, or Sb. Alternatively, the first doped well 12A can be an n-type well and the first electrical dopants can be p-type dopants such as B, Ga, and In.

Second electrical dopants can be implanted into portions of the second doped well 12B that are not covered by the second disposable gate structure (29B, 27B) to form second source and drain extension regions 14B. The first doped well 12A can be masked by a photoresist (not shown) during the implantation of the second electrical dopants to prevent implantation of the second electrical dopants therein. For example, the second doped well 12B can be an n-type well and the second electrical dopants can be p-type dopants. Alternatively, the second doped well 12B can be a p-type well and the second electrical dopants can be n-type dopants.

Dielectric gate spacers can be formed on sidewalls of each of the disposable gate structures, for example, by deposition of a conformal dielectric material layer and an anisotropic etch. The dielectric gate spacers include a first dielectric gate spacer 52A formed around the first disposable gate structure (29A, 27A) and a second dielectric gate spacer 52B formed around the second disposable gate structure (29B, 27B).

Dopants having the same conductivity type as the first electrical dopants can be implanted into portions of the first doped well 12A that are not covered by the first disposable gate structure (29A, 27A) and the first dielectric gate spacer 52A to form first source and drain regions 16A. The second doped well 12B can be masked by a photoresist (not shown) during this implantation to prevent undesired implantation therein. Similarly, dopants having the same conductivity type as the second electrical dopants are implanted into portions of the second doped well 12B that are not covered by the second disposable gate structure (29B, 27B) and the second dielectric gate spacer 52B to form second source and drain regions 16B. The first doped well 12A can be masked by a photoresist (not shown) during this implantation to prevent undesired implantation therein.

In some embodiments, the first source and drain regions 16A and/or the second source and drain regions 16B can be formed by replacement of the semiconductor material in the first doped well 12A and/or the semiconductor material in the second doped well 12B with a new semiconductor material having a different lattice constant. In this case, the new semiconductor material(s) is/are typically epitaxially aligned with (a) single crystalline semiconductor material(s) of the first doped well 12A and/or the semiconductor material in the second doped well 12B, and apply/applies a compressive stress or a tensile stress to the semiconductor material of the first doped well 12A and/or the semiconductor material in the second doped well 12B between the first source and drain extension regions 14A and/or between the second source and drain extension regions 14B.

First metal semiconductor alloy portions 46A and second metal semiconductor alloy portions 46B can be formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and second source and drain regions (16A, 16B) include silicon.

A planarization dielectric layer 60 can be deposited over the metal semiconductor alloy portions (46A, 46B), the first and second disposable gate structures (29A, 27A, 29B, 27B), and the first and second dielectric gate spacers (52A, 52B). Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60 can be planarized above the topmost surfaces of the first and second disposable gate structures (29A, 27A, 29B, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

The combination of the first source and drain extension regions 14A, the first source and drain regions 16A, and the first doped well 12A can be employed to subsequently form a first field effect transistor. The combination of the second source and drain extension regions 14B, the second source and drain regions 16B, and the second doped well 12B can be employed to subsequently form a second field effect transistor.

Figure 12:
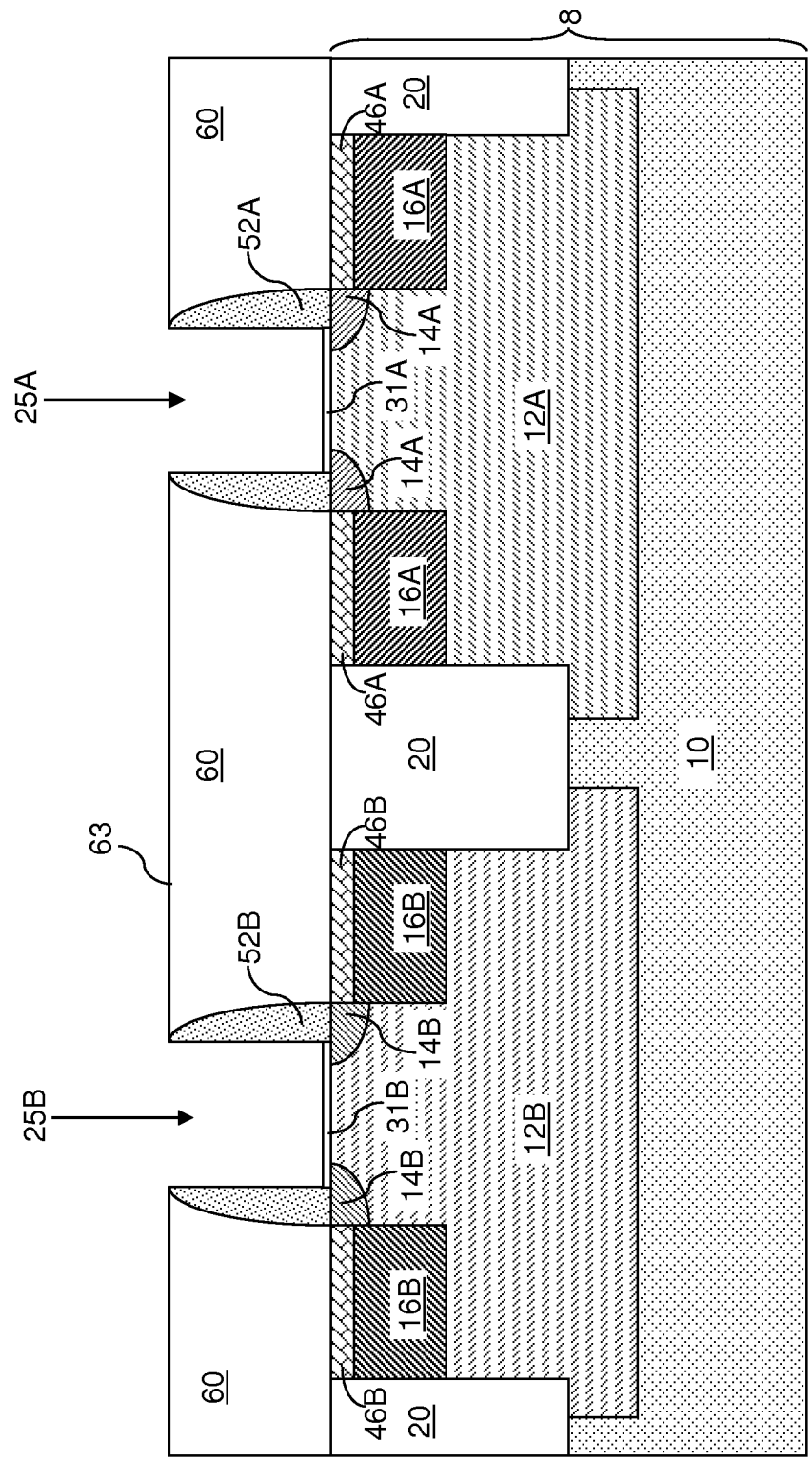
FIG. 12 is a vertical cross-sectional view of the second exemplary semiconductor structure after removal of the disposable gate structures to form gate cavities according to the second embodiment of the present disclosure.

Referring to FIG. 12, the first disposable gate structure (29A, 27A) and the second disposable gate structure (29B, 27B) can be removed by at least one etch. The at least one etch can be a recess etch, which can be an isotropic etch or anisotropic etch. The etch employed to remove the first and second disposable gate material portions (27A, 27B) is selective to the dielectric materials of the planarization dielectric layer 60 and the first and second dielectric gate spacers (52A, 52B). The disposable gate structures (29A, 27A, 29B, 27B) are recessed below the planar dielectric surface 63 to expose the semiconductor surfaces above the first channel and the second channel to form gate cavities (25A, 25B) over the semiconductor substrate 8. The first gate cavity 25A is laterally enclosed by the first dielectric gate spacer 52A, and the second gate cavity 25B is laterally enclosed by the second dielectric gate spacer 52B. The first gate cavity 25A is laterally enclosed by the first dielectric gate spacer 52A, and the second gate cavity 25B is laterally enclosed by the second dielectric gate spacer 52B.

Optionally, a first interfacial dielectric layer 31A can be formed on the exposed surface of the first doped well 12A by conversion of the exposed semiconductor material into a dielectric material, and a second interfacial dielectric layer 31B can be formed on the exposed surface of the second doped well 12B by conversion of the exposed semiconductor material into the dielectric material. Each of the first and second interfacial dielectric layers (31A, 31B) can be a semiconductor-element-containing dielectric layer. The formation of the interfacial dielectric layers (31A, 31B) can be effected by thermal conversion or plasma treatment. If the semiconductor material of the first doped well 12A and the second doped well 12B includes silicon, the interfacial dielectric layers (31A, 31B) can include silicon oxide or silicon nitride. The interfacial dielectric layers (31A, 31B) contact a semiconductor surface underneath and gate dielectrics to be subsequently deposited thereupon. In one embodiment, the first interfacial dielectric layer 31A and the second interfacial dielectric layer 31B can have a same composition and a same thickness.

Figure 13:
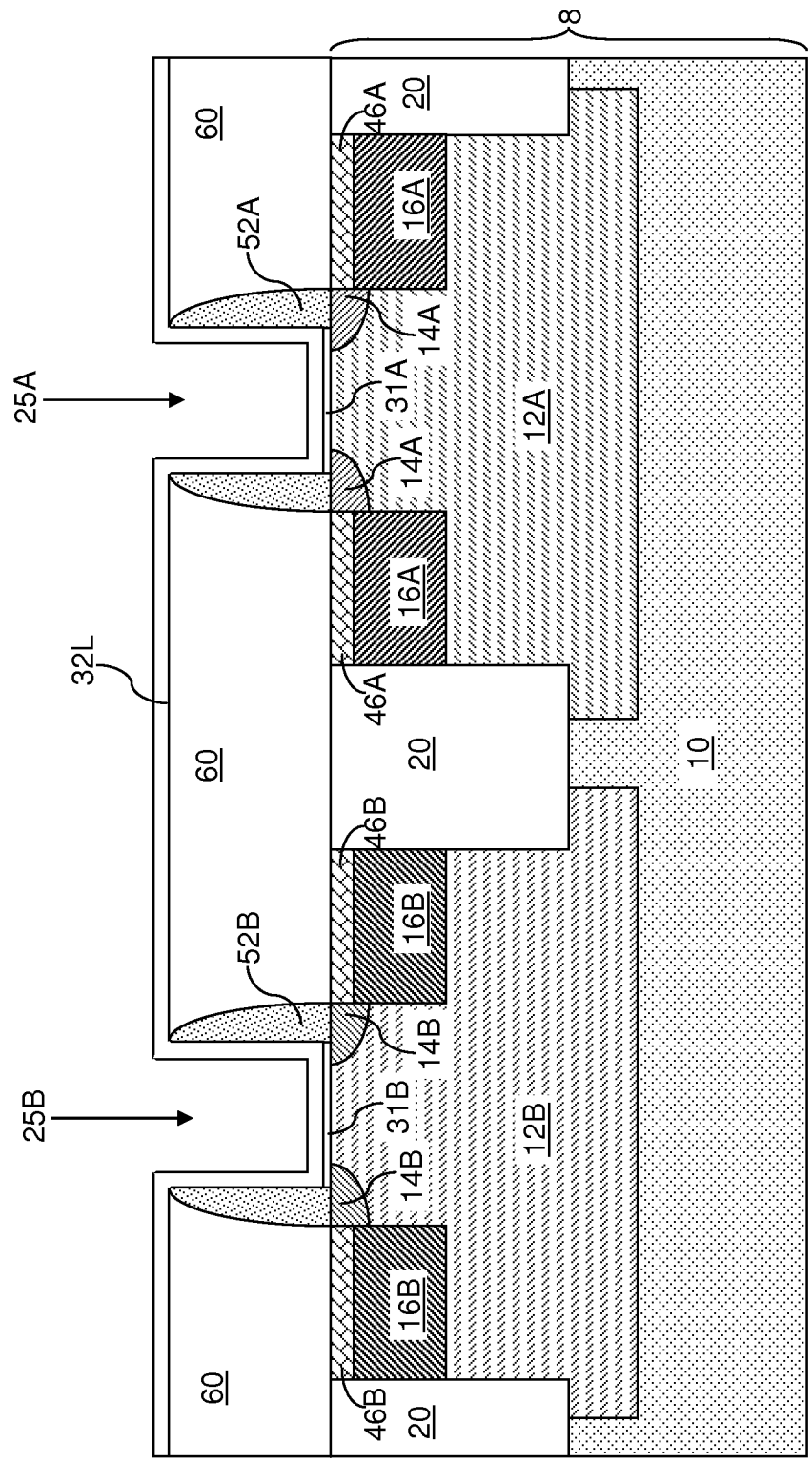
FIG. 13 is vertical cross-sectional view of the second exemplary semiconductor structure after formation of a first high-k dielectric material layer according to the second embodiment of the present disclosure.

Referring to FIG. 13, a first high dielectric constant (high-k) dielectric material layer 32L can be subsequently deposited within the first gate cavity 25A and the second gate cavity 25B. The first high-k dielectric material layer 32L includes a first high-k dielectric material having a dielectric constant greater than 3.9. The first high-k dielectric material of the first high-k dielectric material layer 32L of the second embodiment can have the same composition and thickness as in the first embodiment, and can be formed employing the same methods as in the first embodiment. In one embodiment, the first high-k dielectric material layer 32L can be formed as a conformal layer that contacts the entirety of the top surface of the planarization dielectric layer 60, the entirety of the inner vertical sidewalls of the first and second dielectric gate spacers (52A, 52B), and the top surfaces of the first and second interfacial dielectric layers (31A, 31B).

Figure 14:
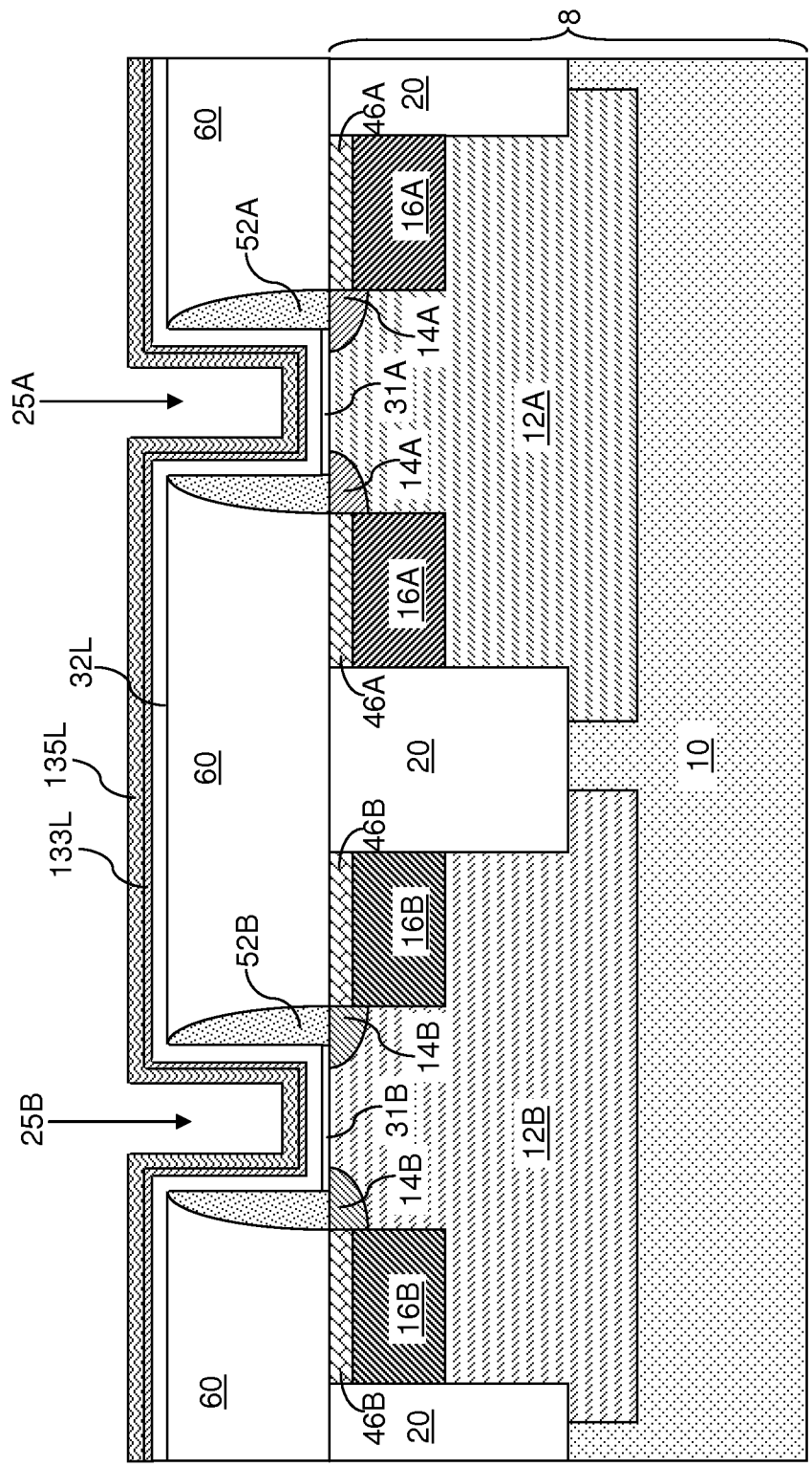
FIG. 14 is a vertical cross-sectional view of the second exemplary semiconductor structure after formation of a first dopant metal layer and a first disposable capping material layer according to the second embodiment of the present disclosure.

Referring to FIG. 14, a first dopant metal layer 133L and a first disposable capping material layer 135L can be subsequently deposited. The first dopant metal layer 133L can be deposited on the entire top surfaces and sidewall surfaces within the gate cavities (25A, 25B) of the first high-k dielectric material layer 32L. In one embodiment, the first dopant metal layer 133L can be a conformal layer. The first disposable capping material layer 135L can be deposited on the entire top surfaces and sidewall surfaces within the gate cavities (25A, 25B) of the first dopant metal layer 133L. In one embodiment, the first disposable capping material layer 135L can be a conformal layer.

The first dopant metal layer 133L of the second embodiment can have the same composition and thickness as in the first embodiment, and can be formed employing the same methods as in the first embodiment. The first disposable capping material layer 135L can have the same composition and thickness as in the first embodiment, and can be formed employing the same methods as in the first embodiment.

Figure 15:
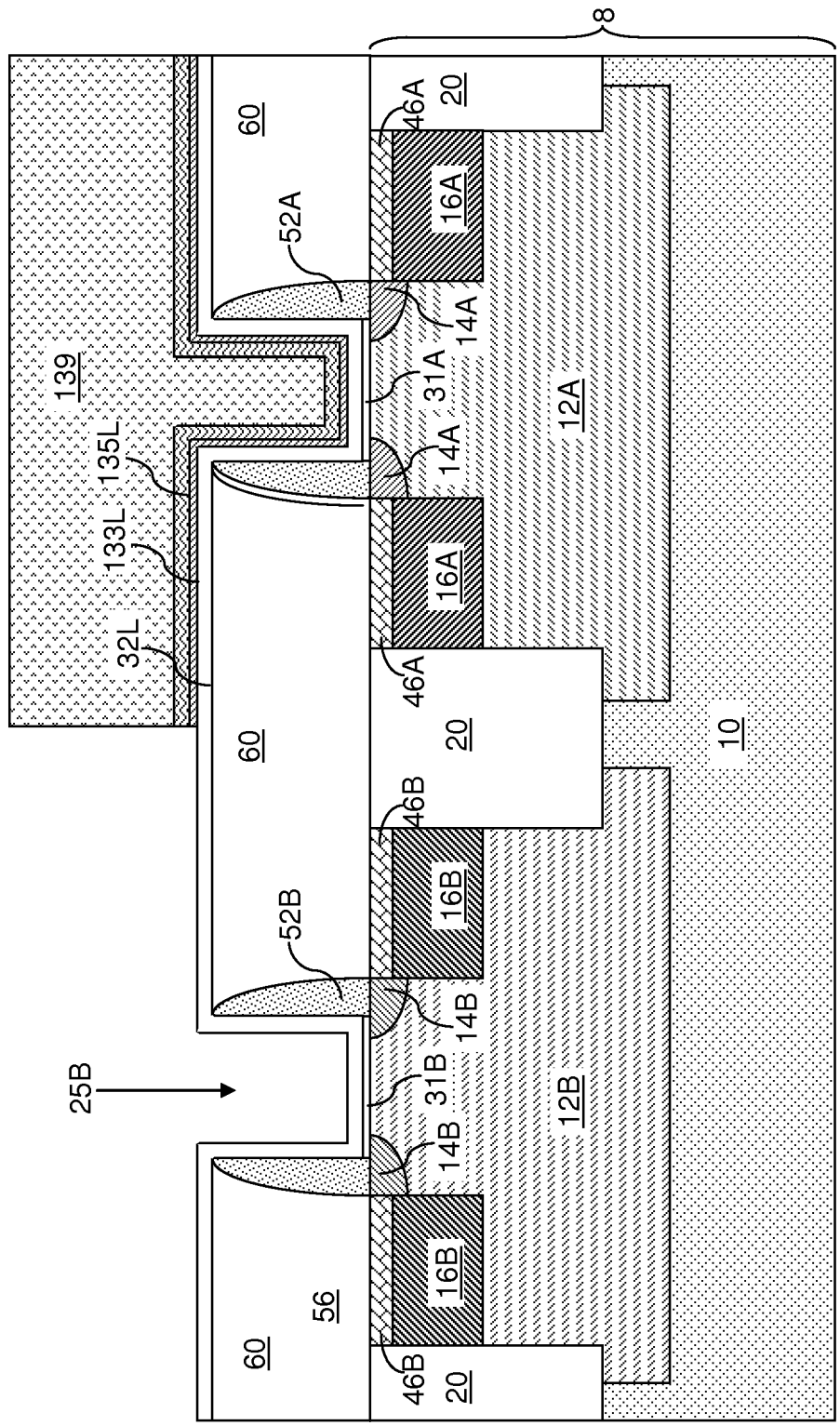
FIG. 15 is a vertical cross-sectional view of the second exemplary semiconductor structure after patterning of the first disposable capping material layer and the first dopant metal layer according to the second embodiment of the present disclosure.

Referring to FIG. 15, a photoresist layer 139 can be applied over the first disposable capping material layer 135L. The photoresist layer 139 can be lithographically patterned to cover the first portion of the first high-k dielectric material layer 32L that overlies the first doped well 12A, and to physically expose the second portion of the first high-k dielectric material layer 32L that overlies the second doped well 12B. A sidewall of the photoresist layer 139 can be located over a portion of the shallow trench isolation structures 20 located between the first doped well 12A and the second doped well 12B.

The portions of the first disposable capping material layer 135L and the first dopant metal layer 133L that are not covered by the photoresist layer 139 can be subsequently removed by an etch, which employs the photoresist layer 139 as an etch mask. The first disposable capping material layer 135L and the first dopant metal layer 133L are removed from above the second portion of the first high-k dielectric material layer 32L that overlies the second doped well 12B, while the first disposable capping material layer 135L and the first dopant metal layer 133L are not removed from above the first portion of the first high-k dielectric material layer 32L that overlies the first doped well 12A. The first disposable capping material layer 135L and the first dopant metal layer 133L can be sequentially removed from above the second portion of the first high-k dielectric material layer 32L. The removal of portions of the first disposable capping material layer 135L and the first dopant metal layer 133L can be removed, for example, by a wet etch. The photoresist layer 139 is subsequently removed, for example, by ashing.

Figure 16:
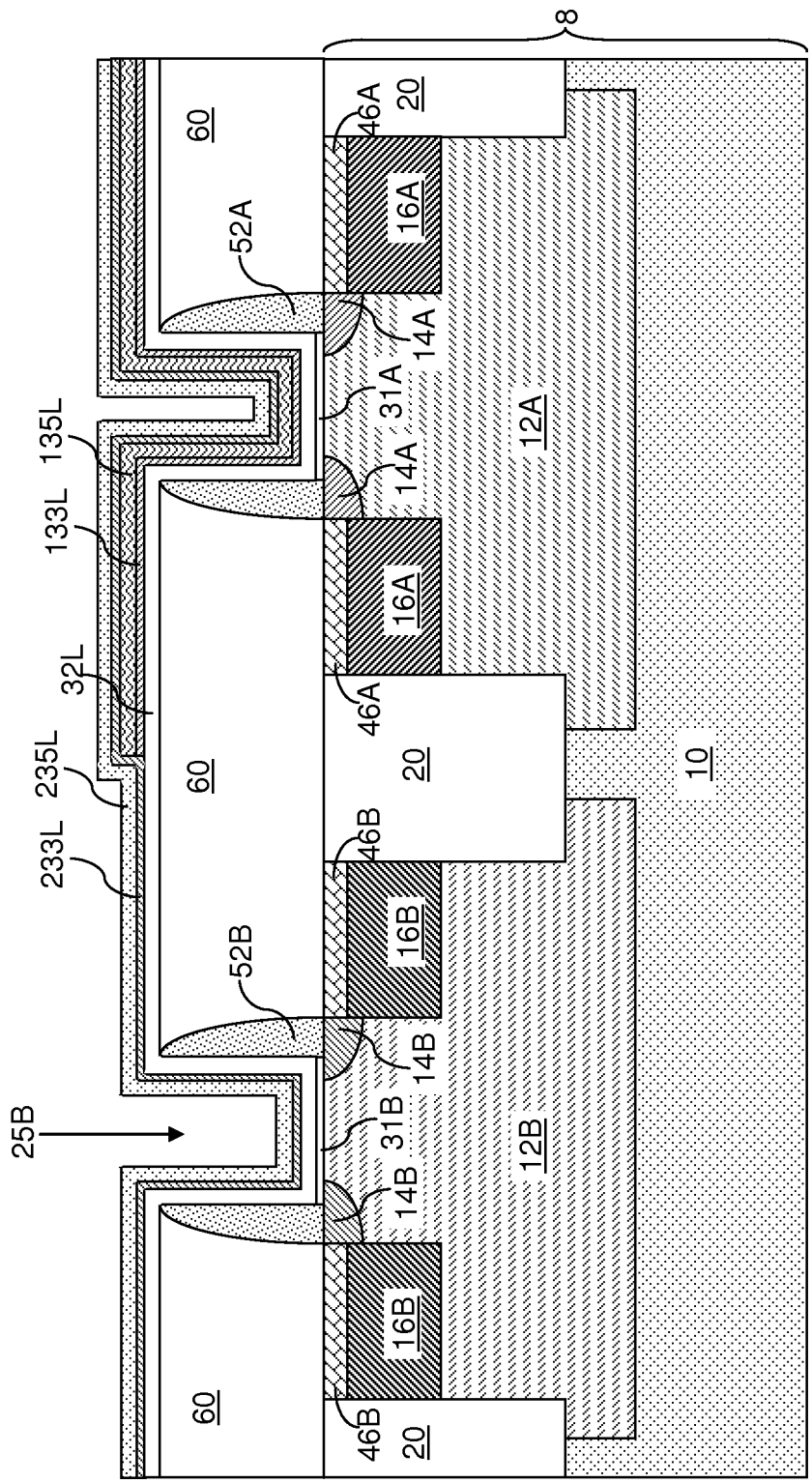
FIG. 16 is a vertical cross-sectional view of the second exemplary semiconductor structure after deposition of a second dopant metal layer and a second disposable capping material layer according to the second embodiment of the present disclosure.

Referring to FIG. 16, a second dopant metal layer 233L and a second disposable capping material layer 235L can be subsequently deposited. The second dopant metal layer 233L is deposited directly on the second portion of the first high-k dielectric material layer 32L overlying the second doped well 12B and directly on a sidewall and a top surface of the first disposable capping material layer 135L that is present over the first doped well 12A.

The second dopant metal layer 233L of the second embodiment can have the same composition and thickness as in the first embodiment, and can be formed employing the same methods as in the first embodiment. The second disposable capping material layer 235L of the second embodiment can have the same composition and thickness as in the first embodiment, and can be formed employing the same methods as in the first embodiment.

Figure 17:
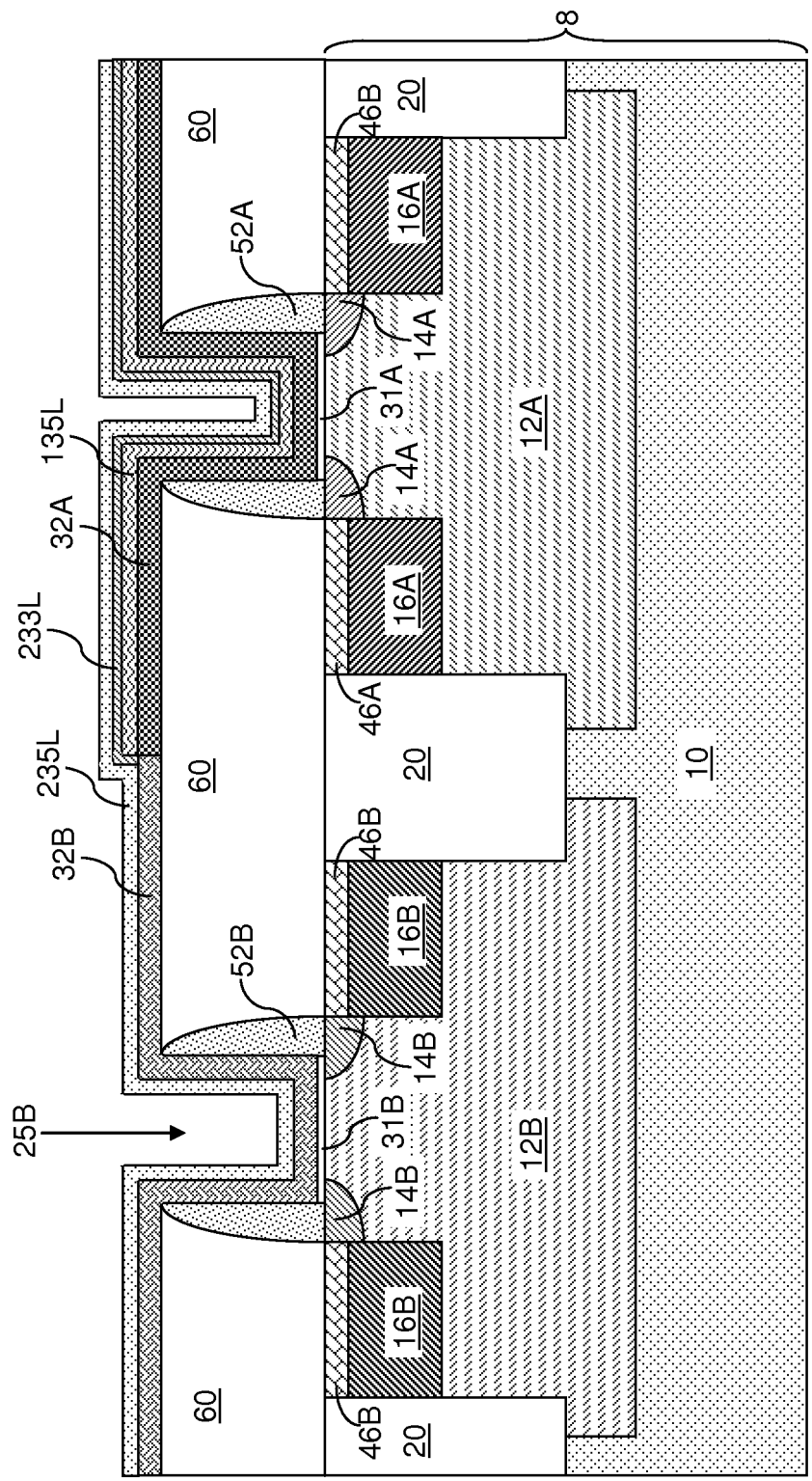
FIG. 17 is a vertical cross-sectional view of the second exemplary semiconductor structure after performing an anneal that forms a first doped high-k gate dielectric layer and a second doped high-k gate dielectric layer according to the second embodiment of the present disclosure.

Referring to FIG. 17, an anneal can be performed at an elevated temperature to form a first doped high-k gate dielectric layer 32A and a second doped high-k gate dielectric layer 32B. The temperature of the anneal can be selected as a temperature at which the materials of the first dopant metal layer 133L and the second dopant metal layer 233L diffuse into underlying portions of the first high-k dielectric material layer. For example, the temperature of the anneal can be in a range from 400° C. to 1,000° C., although lesser and greater temperatures can also be employed.

During the anneal, the material of the first dopant metal layer 133L and the material of the first portion of the first high-k dielectric layer 32L overlying the first doped well 12A interdiffuse into each other, and form the first doped high-k gate dielectric layer 32A. The first doped high-k gate dielectric layer 32A includes the first high-k dielectric material of the first high-k dielectric layer 32L and the first dopant metal of the first dopant metal layer 133L. Likewise, the material of the second dopant metal layer 233L and the material of the second portion of the first high-k dielectric layer 32L overlying the second doped well 12B interdiffuse into each other during the anneal, and form the second doped high-k gate dielectric layer 32B. The second doped high-k gate dielectric layer 32B includes the first high-k dielectric material of the first high-k dielectric layer 32L and the second dopant metal of the second dopant metal layer 233L.

Figure 18:
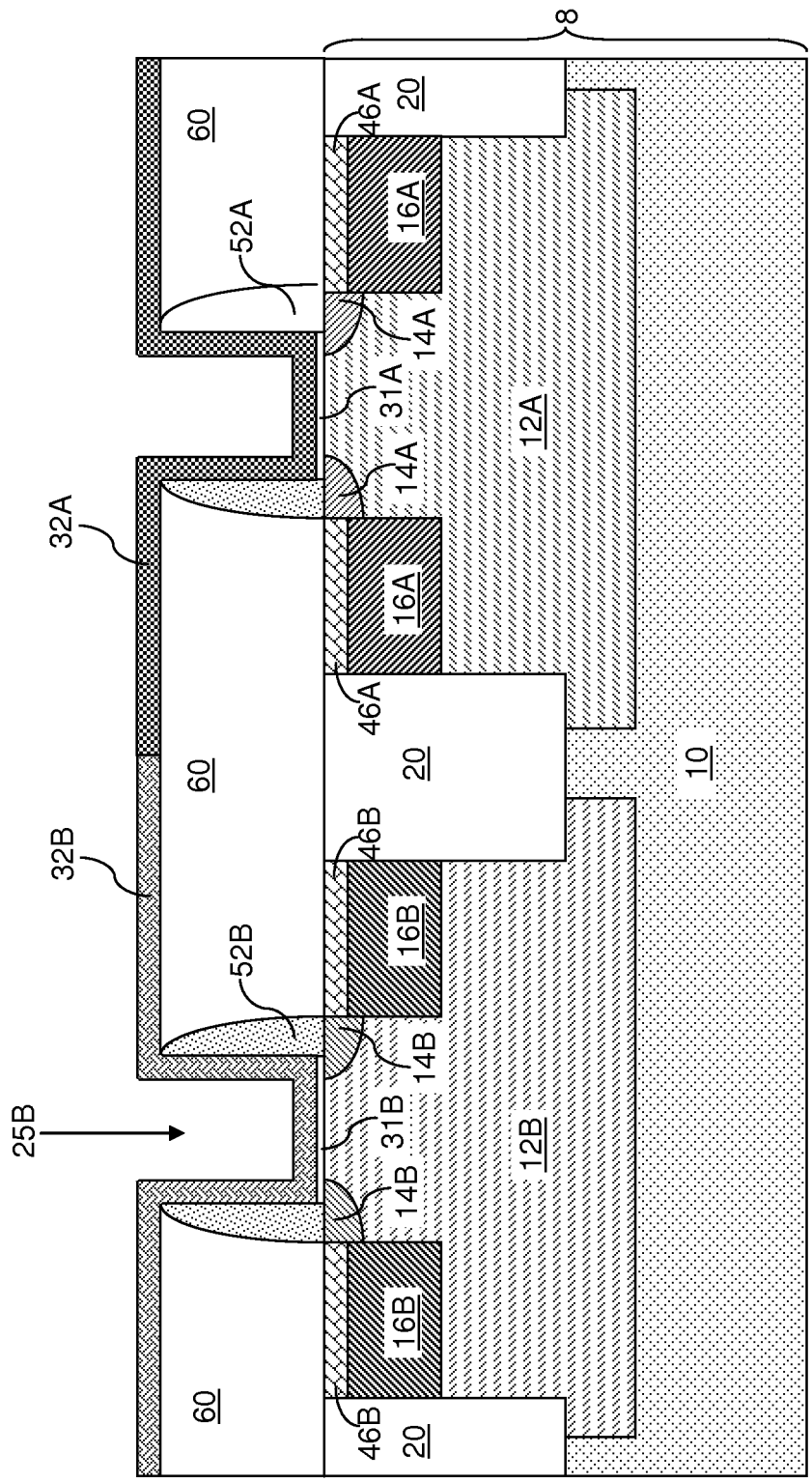
FIG. 18 is a vertical cross-sectional view of the second exemplary semiconductor structure after removal of the second disposable capping material layer, the second dopant metal layer, and the first disposable capping material layer according to the second embodiment of the present disclosure.

Referring to FIG. 18, the second disposable capping material layer 235L, an unreacted portion of the second dopant metal layer 233L overlying the first disposable capping material layer 135L, and the first disposable capping material layer 133L can be sequentially removed selective to the materials of the first doped high-k gate dielectric layer 32A and the second doped high-k gate dielectric layer 32B. The first disposable capping material layer 133L is removed from above the first doped high-k gate dielectric layer 31A. In one embodiment, the second disposable capping material layer 235L and the first disposable capping material layer 135L include a metallic nitride such as TiN, and the etch chemistry employed to remove the second disposable capping material layer 235L and the first disposable capping material layer 135L can be an etch chemistry that removes a metallic material selective to dielectric materials.

Horizontal portions of the first doped high-k gate dielectric layer 32A and horizontal portions of the second doped high-k gate dielectric layer 32B can have the same thickness. The first dopant metal can be present in the first doped high-k gate dielectric layer 32A, and can be absent in the second doped high-k gate dielectric layer 32B. The second dopant metal can be present in the second doped high-k gate dielectric layer 32B, and can be absent in the first doped high-k gate dielectric layer 32A. If the first doped high-k gate dielectric layer 32A and horizontal portions of the second doped high-k gate dielectric layer 32B are conformal, the entirety of the first doped high-k gate dielectric layer 32A and the entirety of the second doped high-k gate dielectric layer 32B can have the same thickness.

Figure 19:
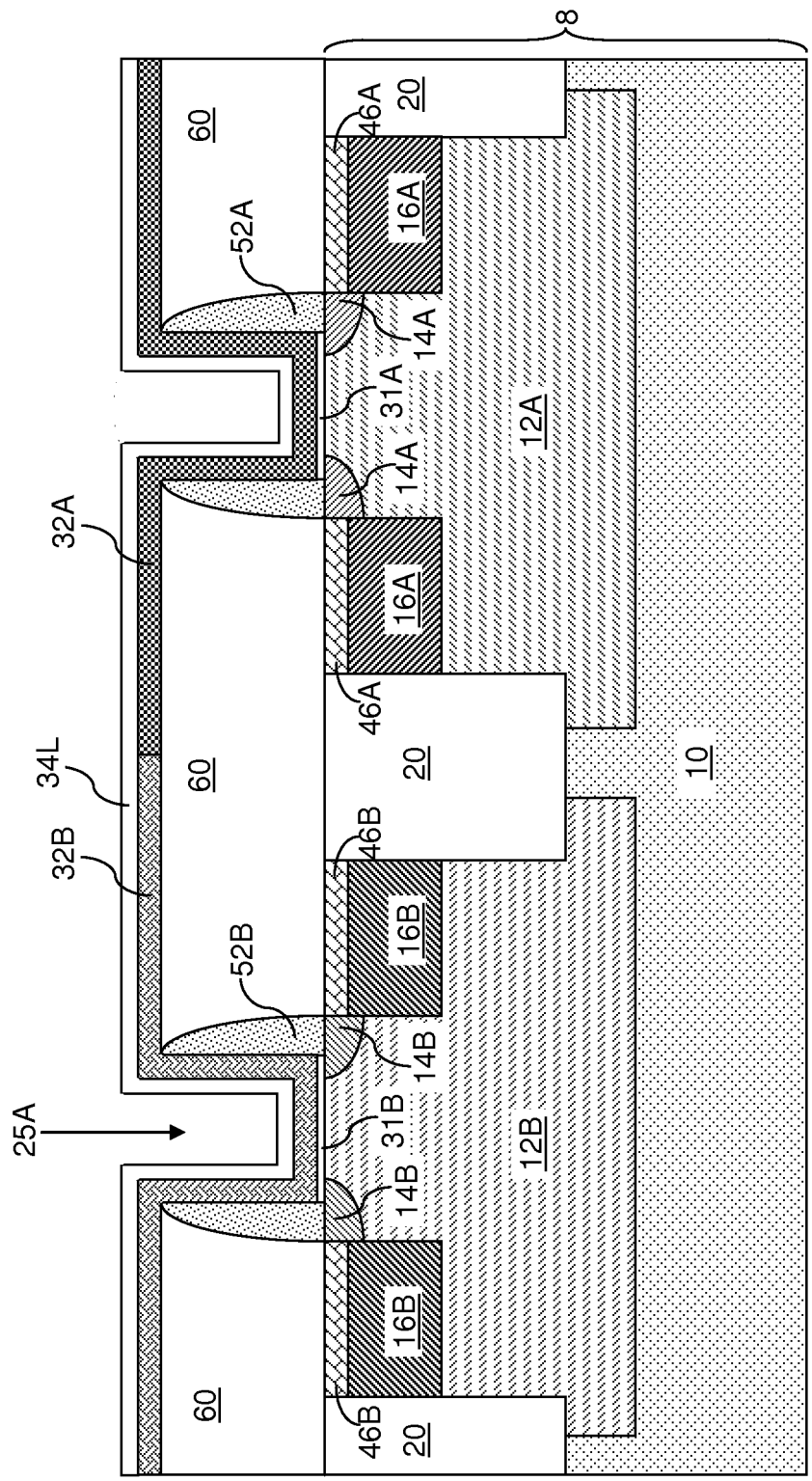
FIG. 19 is a vertical cross-sectional view of the second exemplary semiconductor structure after formation of a second high-k dielectric material layer according to the second embodiment of the present disclosure.

Referring to FIG. 19, a second high-k dielectric material layer 34L can be deposited over the first doped high-k gate dielectric layer 32A and the second doped high-k gate dielectric layer 32B. The second high-k dielectric material layer includes an undoped high-k dielectric material that does not include the first dopant metal or the second dopant metal.

The second high-k dielectric material layer 34L of the second embodiment can have the same composition and thickness as in the first embodiment, and can be formed employing the same methods as in the first embodiment.

Figure 20:
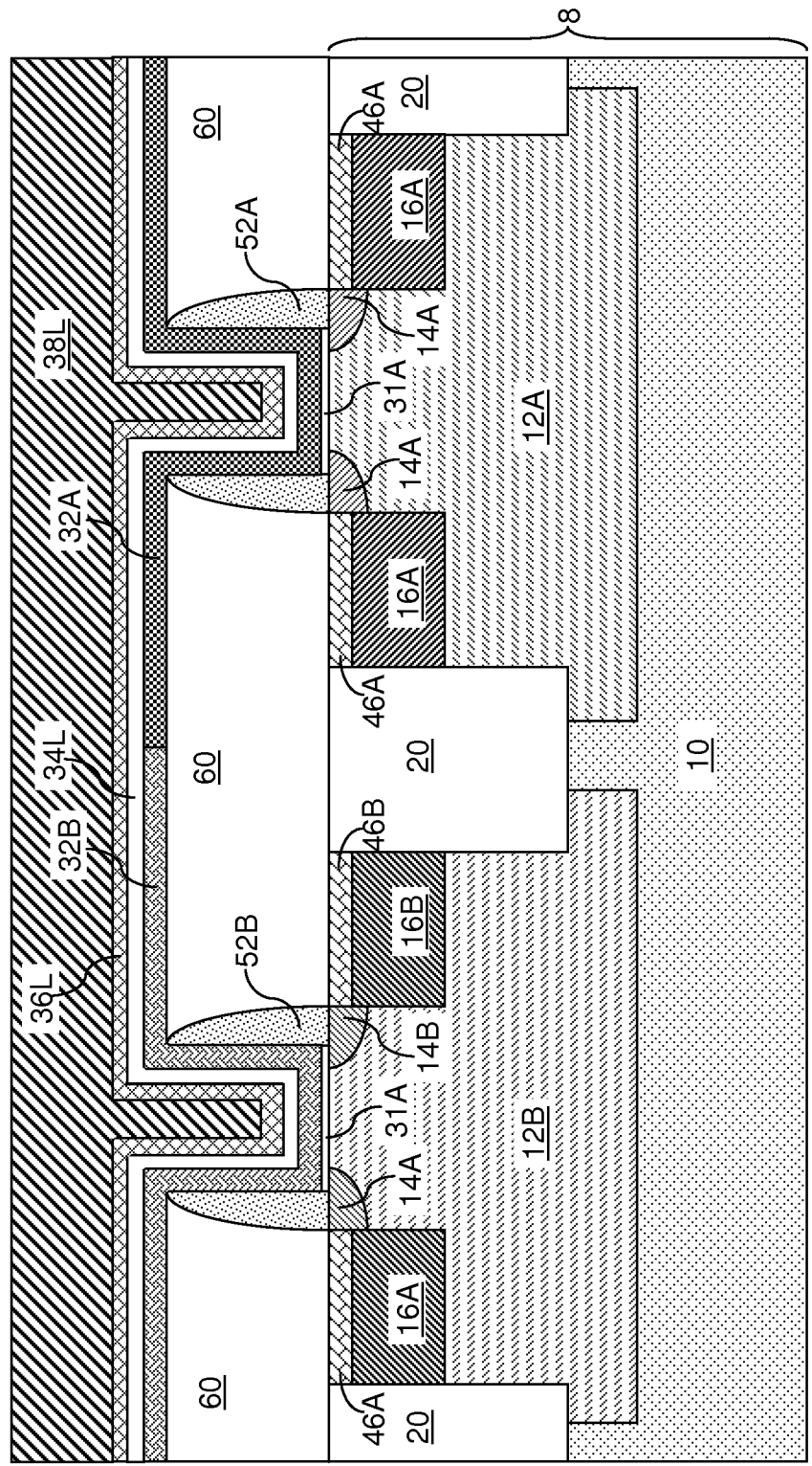
FIG. 20 is a vertical cross-sectional view of the second exemplary semiconductor structure after formation of a gate conductor layer according to the second embodiment of the present disclosure.

Referring to FIG. 20, an optional work function material layer 36L and a gate conductor layer 38L can be sequentially deposited over the second high-k dielectric material layer 34L. The gate conductor layer 38B can fill the first gate cavity 25A and the second gate cavity 25B.

The optional work function material layer 36L of the second embodiment can have the same composition and thickness as in the first embodiment, and can be formed employing the same methods as in the first embodiment. The gate conductor layer 38L of the second embodiment can have the same composition as in the first embodiment, and can be formed employing the same methods as in the first embodiment. The thickness of the gate conductor layer 38L can be selected so that the first gate cavity 25A and the second gate cavity 25B are completely filled by the gate conductor layer 38L.

Figure 21:
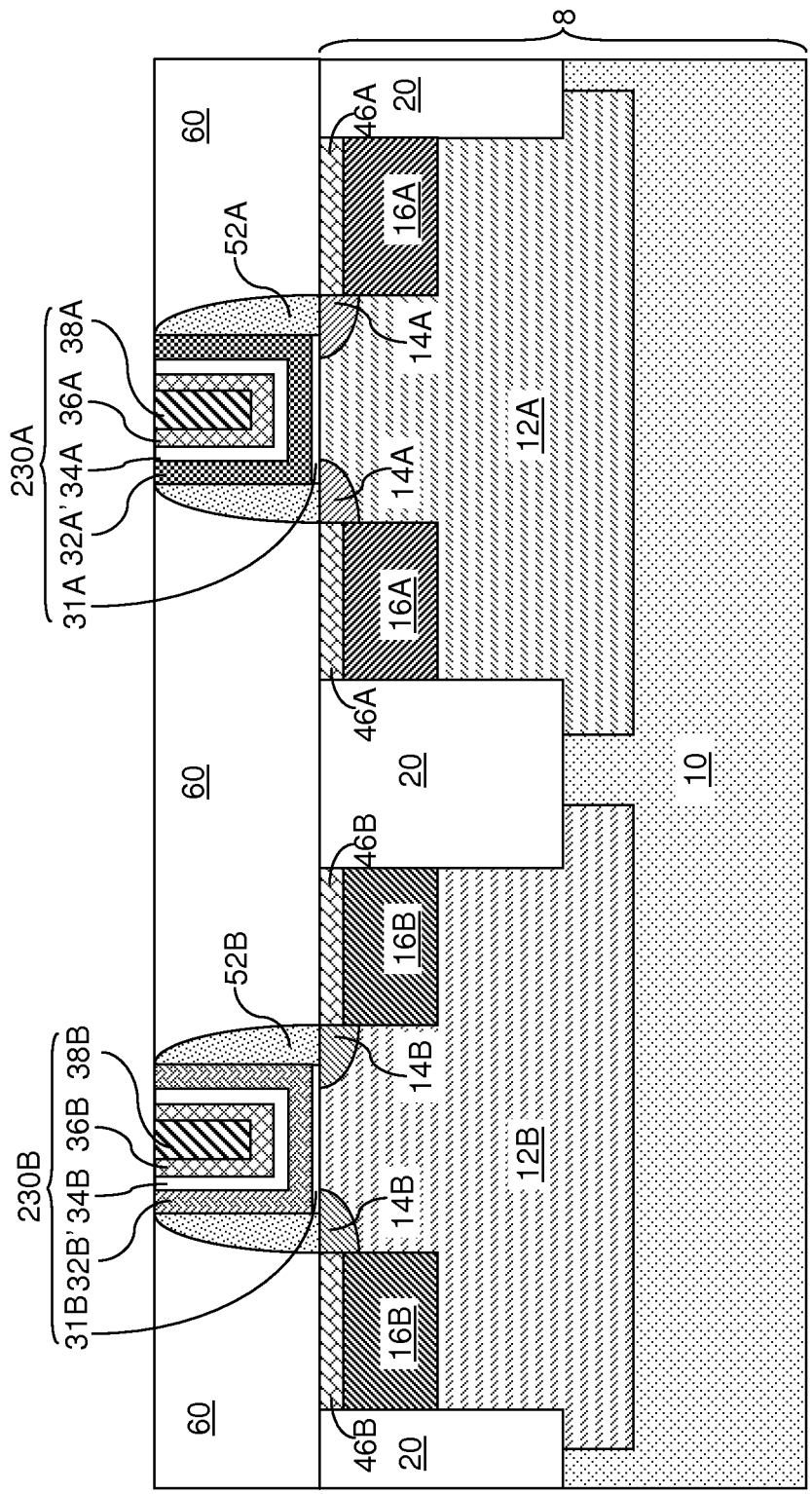
FIG. 21 is a vertical cross-sectional view of the second exemplary semiconductor structure after formation of gate electrodes and gate dielectrics according to the second embodiment of the present disclosure.

Referring to FIG. 21, gate structures can be formed by planarizing of the stack of the first and second doped high-k gate dielectric layers (32A, 32B), the second high-k dielectric material layer 34L, the optional work function material layer 36L, and the gate conductor layer 38L. Specifically, portions of the stack of the first and second doped high-k gate dielectric layers (32A, 32B), the second high-k dielectric material layer 34L, the optional work function material layer 36L, and the gate conductor layer 38L are removed from above the top surface of the planarization dielectric layer 60.

A first gate stack 230A can be formed over the first doped well 12A. The first gate stack 130A includes, from bottom to top, a remaining portion of the first interfacial dielectric 31A, a remaining portion of the first doped high-k gate dielectric layer 32A (which is herein referred to as a first doped high-k gate dielectric 32A'), a first remaining portion of the second high-k dielectric material layer 34L (which is herein referred to as a first undoped high-k gate dielectric 34A), a first remaining portion of the optional work function material layer 36L (which is herein referred to as an optional first work function material portion 36A), and a first remaining portion of the gate conductor layer 38L (which is herein referred to as a first gate conductor portion 38A).

A second gate stack 230B can be formed over the second doped well 12B. The second gate stack 230B includes, from bottom to top, a remaining portion of the second interfacial dielectric 31B, a remaining portion of the second doped high-k gate dielectric layer 32B (which is herein referred to as a second doped high-k gate dielectric 32B'), a second remaining portion of the second high-k dielectric material layer 34L (which is herein referred to as a second undoped high-k gate dielectric 34B), a second remaining portion of the optional work function material layer 36L (which is herein referred to as an optional second work function material portion 36B), and a second remaining portion of the gate conductor layer 38L (which is herein referred to as a second gate conductor portion 38B).

The second exemplary semiconductor structure of FIG. 21 includes a first field effect transistor having a first gate dielectric (31A, 32A', 34A) and a second field effect transistor having a second gate dielectric (31B, 32B', 34B). The first gate dielectric (31A, 32A', 34A) includes the first doped high-k gate dielectric 32A', which includes the first high-k dielectric material having a dielectric constant greater than 3.9 and is doped with the first dopant metal. The first gate dielectric (31A, 32A', 34A) further includes the first undoped high-k gate dielectric 34A, which includes the second high-k gate dielectric material. The second gate dielectric (31B, 32B', 34B) includes the second doped high-k gate dielectric 32B', which includes the first high-k dielectric material and is doped with the second dopant metal that is different from the first dopant metal. The second gate dielectric (31B, 32B', 34B) further includes the second undoped high-k gate dielectric 34B, which includes the second high-k gate dielectric material.

In one embodiment, the first doped high-k gate dielectric 32A' and the second doped high-k gate dielectric 32B' can have the same thickness, which is herein referred to as a first thickness. In one embodiment, the first undoped high-k gate dielectric 34A and the second undoped high-k gate dielectric 34B have a same second thickness, which is herein referred to as a second thickness.

In one embodiment, the first doped high-k gate dielectric 32A' does not include the second dopant metal, and the second doped high-k gate dielectric 32B' does not include the first dopant metal. In one embodiment, each of the first and second undoped high-k gate dielectric (34A, 34B) can consist of the second high-k gate dielectric material.

In one embodiment, each of the first doped high-k gate dielectric 32A', the first undoped high-k gate dielectric 34A, the second doped high-k gate dielectric 32B', and the second undoped high-k gate dielectric 34B can include a horizontal portion and vertical portions that extend upward from peripheries of the horizontal portion, i.e., can be U-shaped. The topmost surfaces of the first doped high-k gate dielectric 32A' and the first undoped high-k gate dielectric 34A can be coplanar with the topmost surface of the first gate electrode (36A, 38A) contacting the first gate dielectric (31A, 32A', 34A), and topmost surfaces of the second doped high-k gate dielectric 32B' and the second undoped high-k gate dielectric 34B can be coplanar with the topmost surface of the second gate electrode (36B, 38B) contacting the second gate dielectric (31B, 32B', 34B).

In one embodiment, the first gate dielectric (31A, 32A', 34A) can include the first interfacial dielectric 31A contacting the channel of the first field effect transistor and the first doped high-k gate dielectric 34A, and the second gate dielectric (31B, 32B', 34B) can include the second interfacial dielectric 31B contacting the channel of the second field effect transistor and the second doped high-k gate dielectric 34B.

In one embodiment, each of the first high-k dielectric material and the second high-k gate dielectric material can be selected from $HfO_2$, $ZrO_2$, and $TiO_2$. In one embodiment, the first high-k dielectric material can be the same as the second high-k gate dielectric material. In one embodiment, the first dopant metal can be selected from rare earth elements, and the second dopant metal can be selected from Al, Ga, and In.

Figure 22:
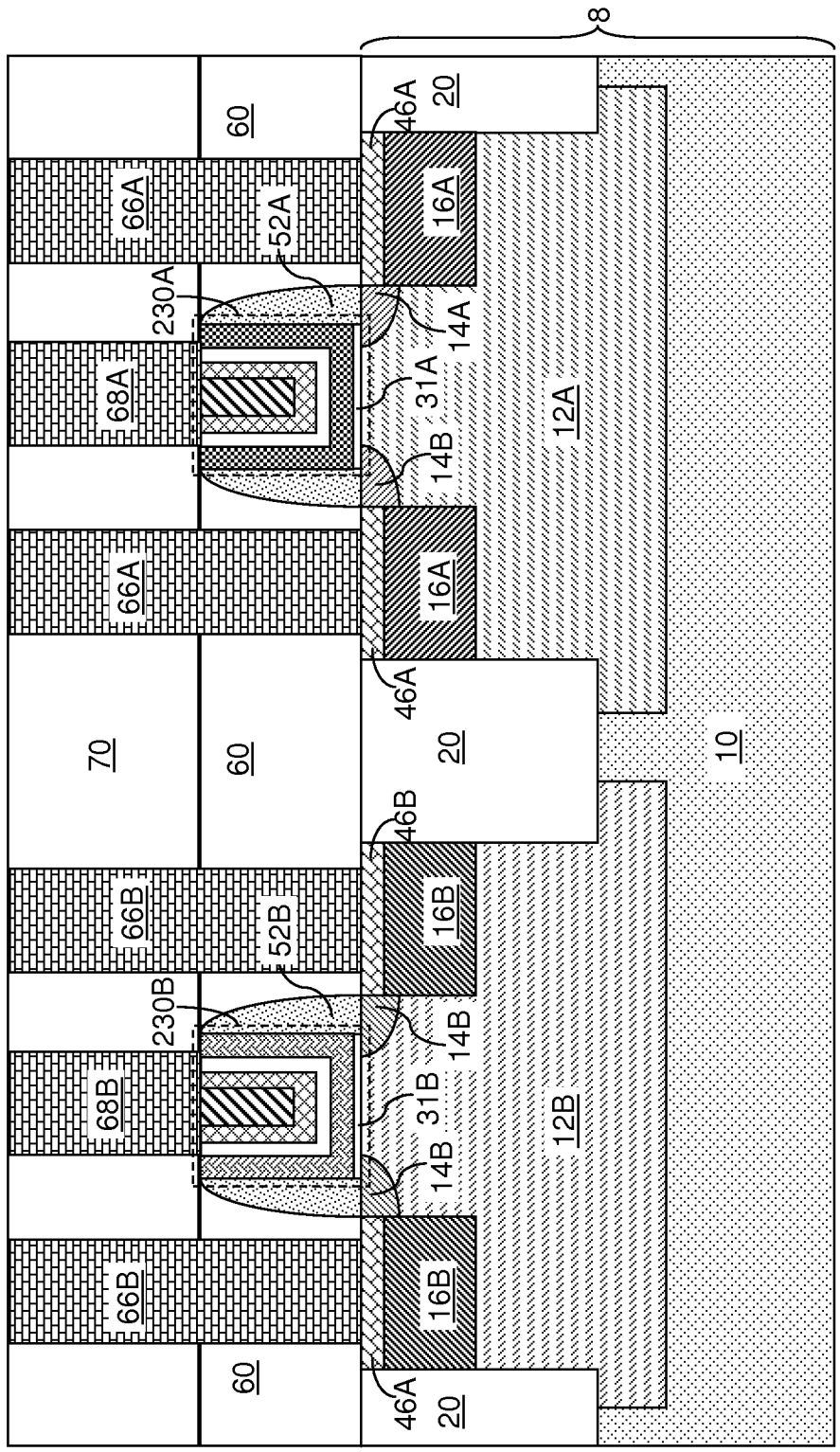
FIG. 22 is a vertical cross-sectional view of the second exemplary semiconductor structure after formation of a contact-level dielectric layer and formation of various contact via structures according to the second embodiment of the present disclosure.

Referring to FIG. 22, a contact-level dielectric layer 70 can be deposited over semiconductor substrate 8 and the first and second gate stacks (130A, 130B). Various contact via structures can be formed, for example, by formation of contact via cavities by a combination of lithographic patterning and an anisotropic etch followed by deposition of a conductive material and planarization that removes an excess portion of the conductive material from above the contact-level dielectric layer 70. The various contact via structures can include, for example, first source/drain contact via structures 66A, second source/drain contact via structures 66B, a first gate contact via structure 68A, and a second gate contact via structure 68B.

Figure 23:
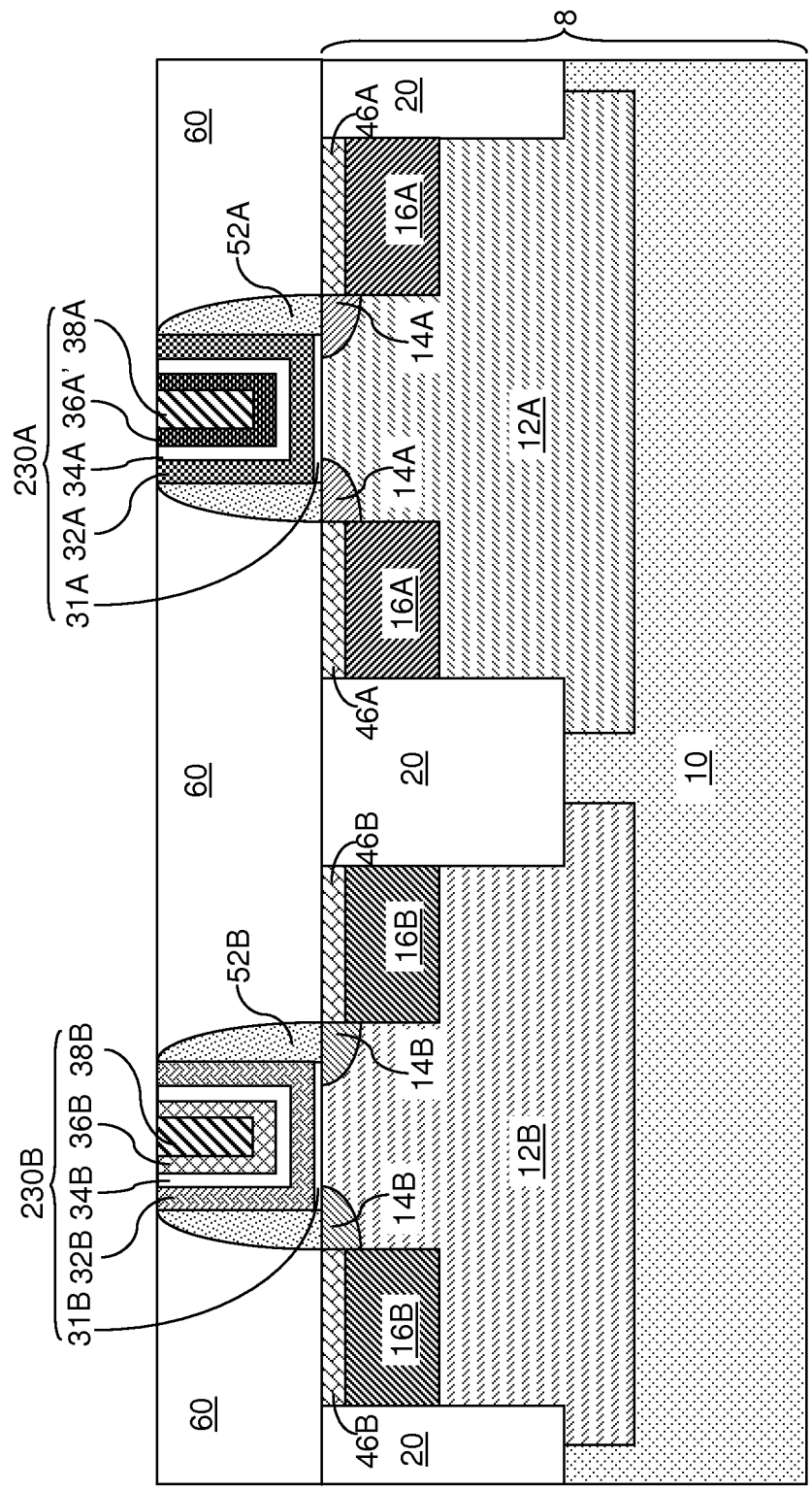
FIG. 23 is a variation of the second exemplary semiconductor structure at a processing step corresponding to the step of FIG. 21.

Referring to FIG. 23, a variation of the second exemplary semiconductor structure can be derived from the second exemplary semiconductor structure by employing different materials for the first work function material portion 36A' and for the second work function material portion 36B'. The variation of the second exemplary semiconductor structure can be formed by depositing a first work function material layer on the second high-k dielectric material layer, by removing a portion of the first work function material layer from above one of the first doped well 12A and the second doped well 12B while not removing the first work function material layer from above the other of the first doped well 12A and the second doped well 12B, and by depositing a second work function material layer including a different work function material than the material of the first work function material layer.

Figure 24:
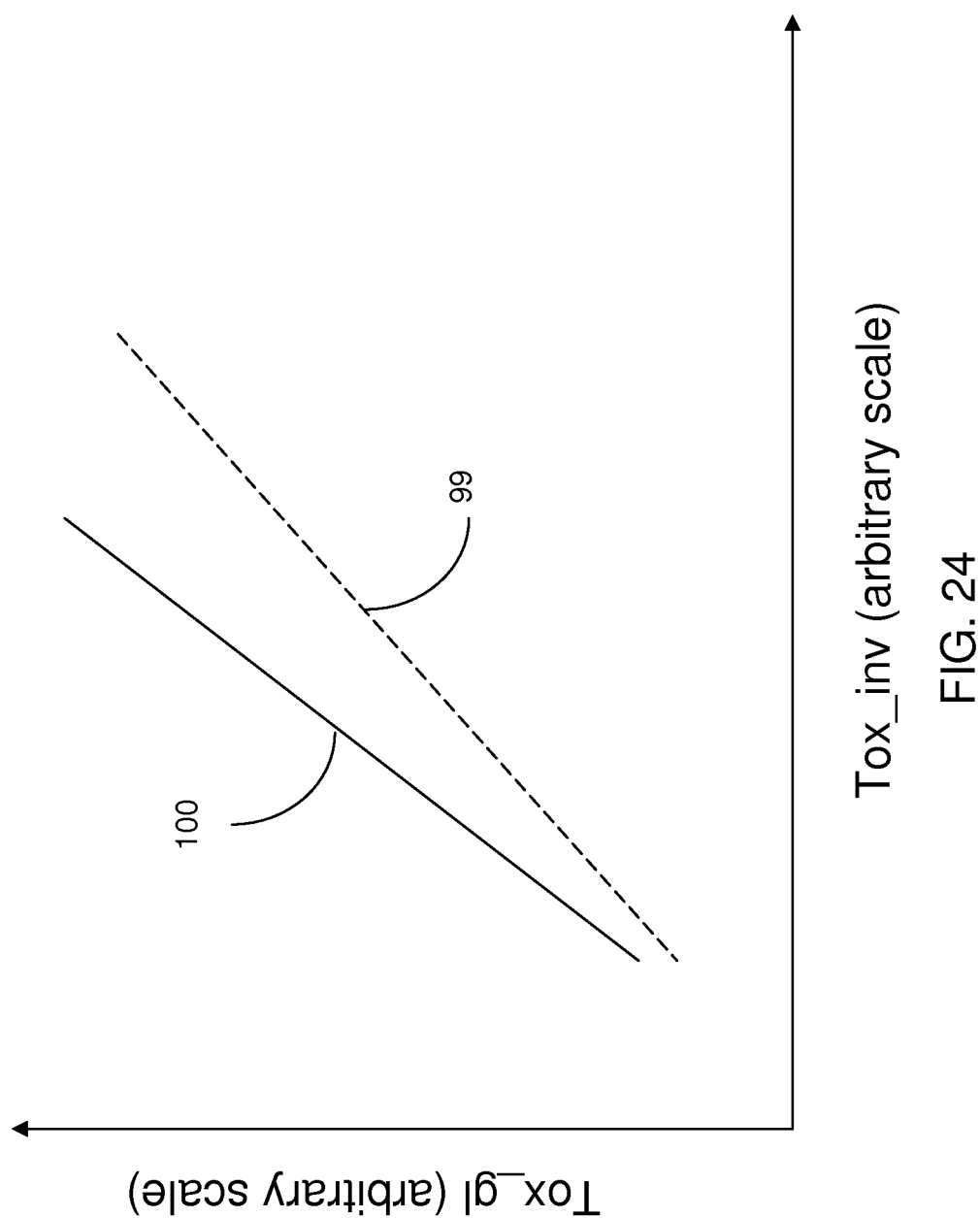
FIG. 24 is a graph schematically illustrating an advantage of embodiments of the present disclosure.

Referring to FIG. 24, a graph illustrating the correlation is shown between the gate dielectric thickness as measured by the thickness of an inversion layer in a channel (Tox_inv) and the gate dielectric thickness as measured by the gate leakage current (Tox_gl) for prior art high-k gate dielectric materials and for the gate dielectrics according to embodiments of the present disclosure. The horizontal axis and the vertical axis are in arbitrary scales. The curve 99 illustrates the correlation for prior art gate dielectrics, and the curve 100 illustrates the correlation for the gate dielectrics according to embodiments of the present disclosure. For the same gate dielectric thickness as measured by the thickness of an inversion layer in a channel, the gate dielectrics according to embodiments of the present disclosure can provide a greater gate dielectric thickness as measured by the gate leakage current, i.e., a lesser gate leakage current, thereby providing enhanced performance for field effect transistors.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Processing steps that do not specify chemistries or other processing parameters can performed employing chemistries or parameters known in the art. Accordingly, the disclosure is intended to encompass all such alternatives, modifications and variations which fall within the scope and spirit of the disclosure and the following claims.

What is claimed is:

1. A semiconductor structure comprising:
a first field effect transistor having a first gate dielectric, said first gate dielectric comprising a first doped high dielectric constant (high-k) gate dielectric, which comprises a first high-k dielectric material having a dielectric constant greater than 3.9 and doped with a first dopant metal, and a first undoped high-k gate dielectric, which comprises a second high-k gate dielectric material selected from the group consisting of $HfO_2$, $ZrO_2$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each x is independently from 0.5 to 3 and each y is independently from 0 to 2; and
a second field effect transistor having a second gate dielectric, said second gate dielectric comprising a second doped high-k gate dielectric, which comprises said first high-k dielectric material and doped with a second dopant metal that is different from said first dopant metal, and a second undoped high-k gate dielectric, which comprises said second high-k gate dielectric material selected from the group consisting of $HfO_2$, $ZrO_2$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, wherein each x is independently from 0.5 to 3 and each y is independently from 0 to 2.

2. The semiconductor structure of claim 1, wherein said first doped high-k gate dielectric and said second doped high-k gate dielectric have a same first thickness.

3. The semiconductor structure of claim 2, wherein said first undoped high-k gate dielectric and said second undoped high-k gate dielectric have a same second thickness.

4. The semiconductor structure of claim 2, wherein said first doped high-k gate dielectric consists of said first high-k dielectric material and said first dopant metal, and said second doped high-k gate dielectric consists of said first high-k dielectric material and said second dopant metal.

5. The semiconductor structure of claim 4, wherein each of said first and second undoped high-k gate dielectric consists of said second high-k gate dielectric material.

6. The semiconductor structure of claim 1, wherein each of said first doped high-k gate dielectric, said first undoped high-k gate dielectric, said second doped high-k gate dielectric, and said second undoped high-k gate dielectric is a planar layer.

7. The semiconductor structure of claim 1, wherein each of said first doped high-k gate dielectric, said first undoped high-k gate dielectric, said second doped high-k gate dielectric, and said second undoped high-k gate dielectric comprises a horizontal portion and vertical portions that extend upward from peripheries of a horizontal portion.

8. The semiconductor structure of claim 7, wherein topmost surfaces of vertical portions of said first doped high-k gate dielectric and said first undoped high-k gate dielectric are coplanar with a topmost surface of a first gate electrode contacting said first gate dielectric, and topmost surfaces of vertical portions of said second doped high-k gate dielectric and said second undoped high-k gate dielectric are coplanar with a topmost surface of a second gate electrode contacting said second gate dielectric.

9. The semiconductor structure of claim 1, wherein said first gate dielectric further comprises a first interfacial dielectric contacting a channel of said first field effect transistor and said first doped high-k gate dielectric, and said second gate dielectric further comprises a second interfacial dielectric contacting a channel of said second field effect transistor and said second doped high-k gate dielectric.

10. The semiconductor structure of claim 1, wherein each of said first high-k dielectric material and said second high-k gate dielectric material is selected from $HfO_2$, $ZrO_2$, and $TiO_2$.

11. The semiconductor structure of claim 10, wherein said first high-k dielectric material is the same as said second high-k gate dielectric material.

12. The semiconductor structure of claim 1, wherein said first dopant metal is selected from rare earth elements, and said second dopant metal is selected from Al, Ga, and In.

* * * * *

UNITED STATES PATENT AND TRADEMARK OFFICE
CERTIFICATE OF CORRECTION

| | | |
|---|---|---|
| PATENT NO. | : 9,029,959 B2 | Page 1 of 1 |
| APPLICATION NO. | : 13/537101 | |
| DATED | : May 12, 2015 | |
| INVENTOR(S) | : MaryJane Brodsky et al. | |

It is certified that error appears in the above-identified patent and that said Letters Patent is hereby corrected as shown below:

Title page, item (73) Assignee: should read:

-- (73) Assignee: International Business Machines Corporation, Armonk, NY (US)
GLOBALFOUNDRIES Inc., Grand Cayman, CAYMAN ISLANDS --.

Signed and Sealed this
Thirteenth Day of October, 2015

Michelle K. Lee
*Director of the United States Patent and Trademark Office*